United States Patent
Sun et al.

(10) Patent No.: US 9,859,120 B1
(45) Date of Patent: Jan. 2, 2018

(54) METHOD OF MAKING SELF-ALIGNED CONTINUITY CUTS IN MANDREL AND NON-MANDREL METAL LINES

(71) Applicant: GLOBALFOUNDRIES Inc., Grand Cayman (KY)

(72) Inventors: Lei Sun, Albany, NY (US); Ruilong Xie, Schenectady, NY (US); Xunyuan Zhang, Albany, NY (US); Ryan Ryoung-Han Kim, Bertem (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/377,125

(22) Filed: Dec. 13, 2016

(51) Int. Cl.
| H01L 21/4763 | (2006.01) |
| H01L 21/033 | (2006.01) |
| H01L 21/768 | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/7684* (2013.01); *H01L 21/76816* (2013.01); *H01L 21/76877* (2013.01)

(58) Field of Classification Search
USPC .......................................................... 438/633
See application file for complete search history.

(56) References Cited

U.S. PATENT DOCUMENTS

| 2014/0170853 A1 | 6/2014 | Shamma et al. |
| 2015/0072527 A1 | 3/2015 | Ng et al. |
| 2015/0147882 A1 | 5/2015 | Yao et al. |
| 2016/0049307 A1 | 2/2016 | Chen |
| 2016/0064248 A1 | 3/2016 | Lee et al. |
| 2016/0086841 A1 | 3/2016 | Song et al. |

*Primary Examiner* — Timor Karimy
(74) *Attorney, Agent, or Firm* — Heslin Rothenberg Farley & Mesiti P.C.

(57) ABSTRACT

A method includes providing a structure having a dielectric layer, a $1^{st}$ hardmask layer, a $2^{nd}$ hardmask layer and a $1^{st}$ mandrel layer disposed respectively thereon. A $1^{st}$ mandrel plug is disposed in the 1st mandrel layer. A $2^{nd}$ mandrel layer is disposed over the $1^{st}$ mandrel layer. The $1^{st}$ and $2^{nd}$ mandrel layers are etched to form a plurality 1st mandrels, wherein the $1^{st}$ mandrel plug extends entirely through a single $1^{st}$ mandrel. The $1^{st}$ mandrel plug is etched such that it is self-aligned with sidewalls of the single $1^{st}$ mandrel. The $1^{st}$ mandrels are utilized to form mandrel metal lines in the dielectric layer. The $1^{st}$ mandrel plug is utilized to form a self-aligned mandrel continuity cut in a single mandrel metal line formed by the single $1^{st}$ mandrel.

10 Claims, 23 Drawing Sheets

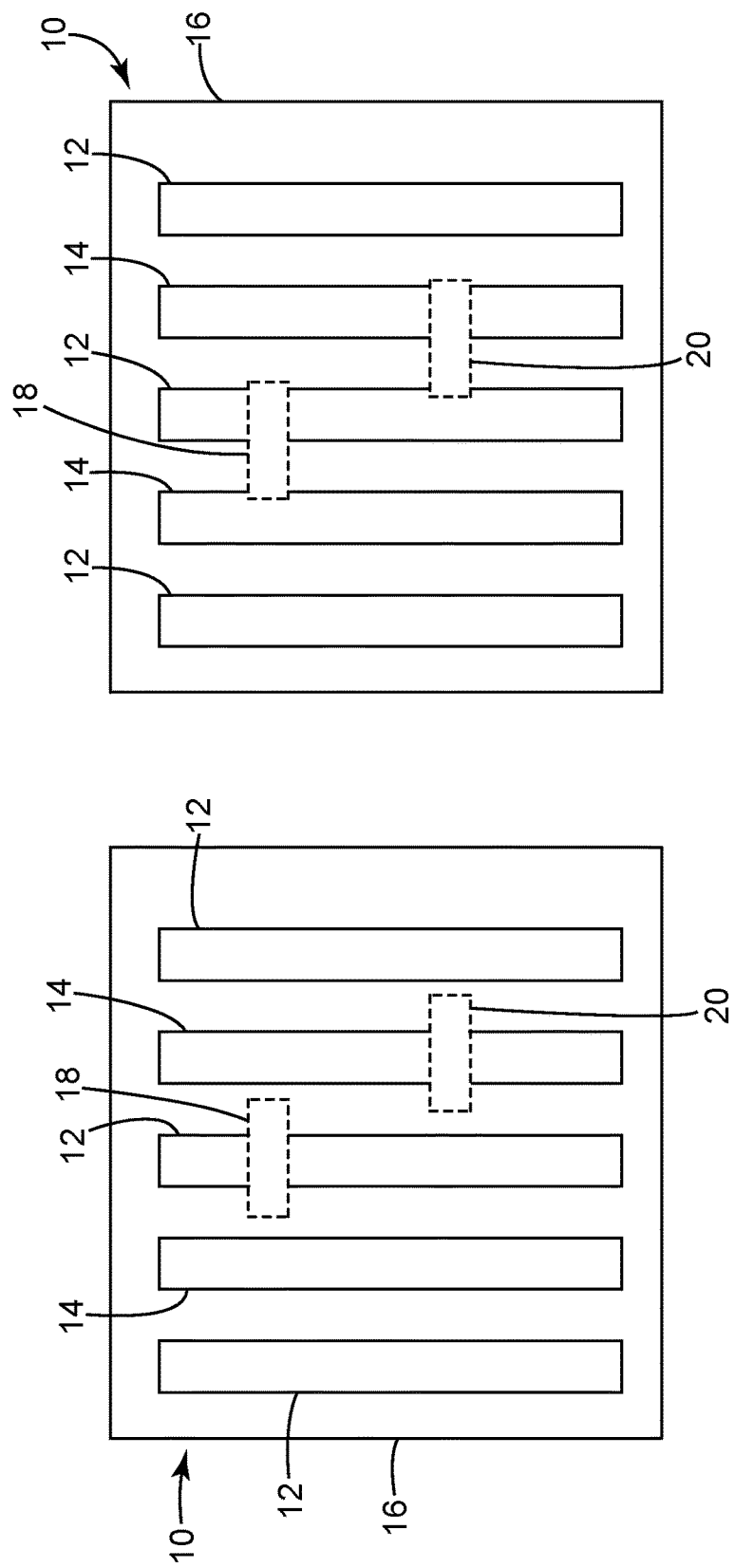

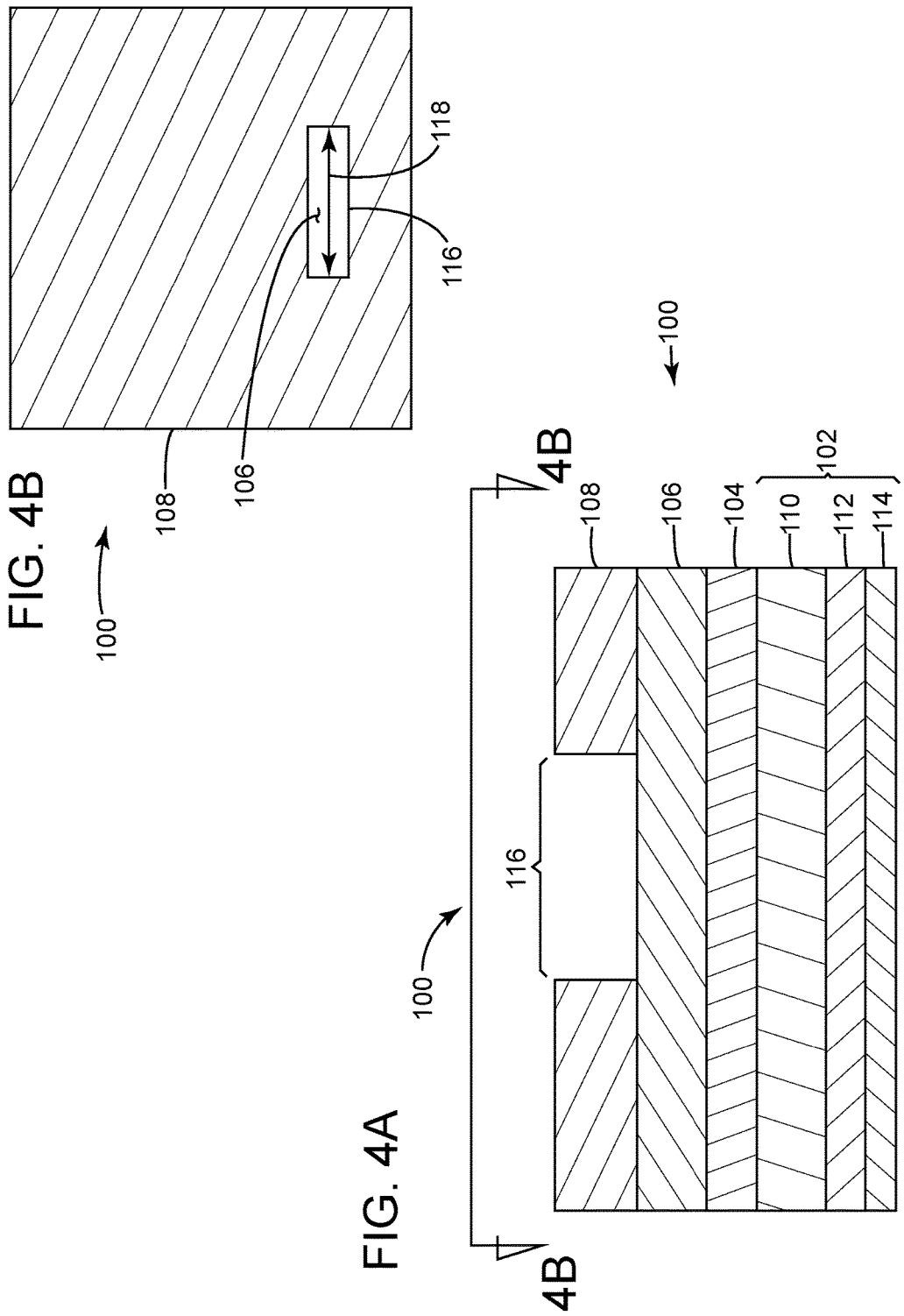

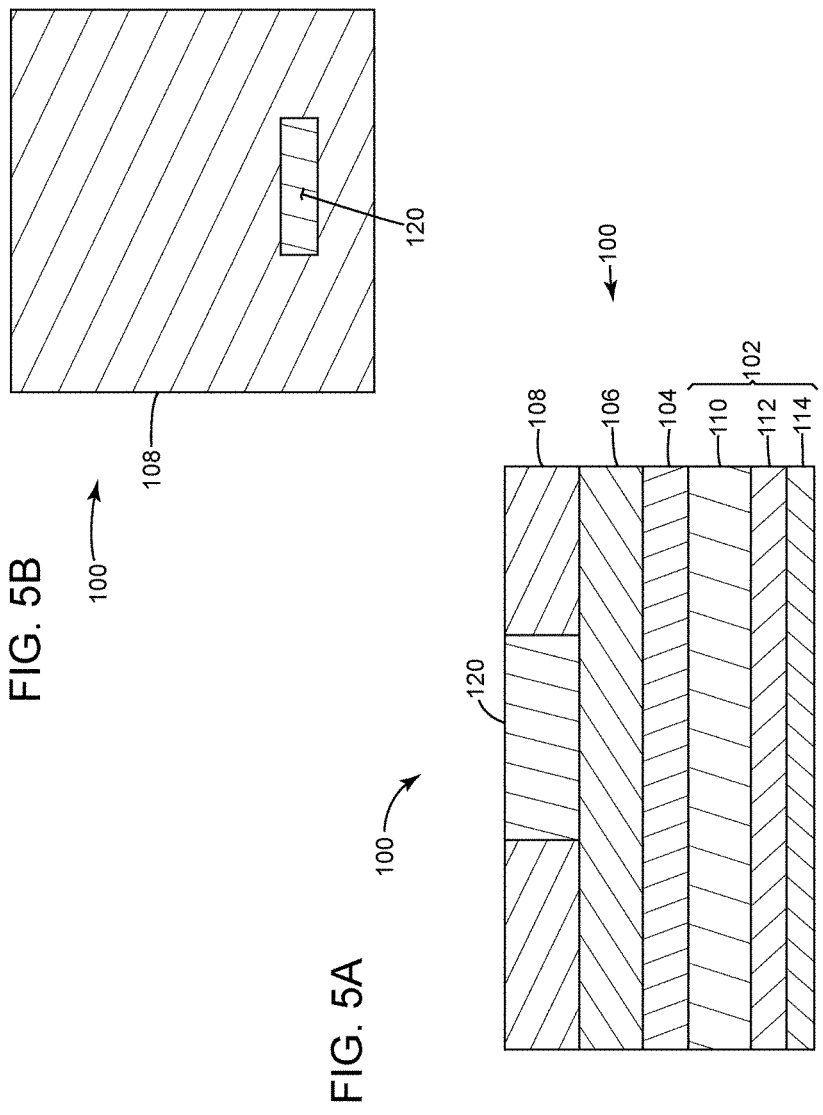

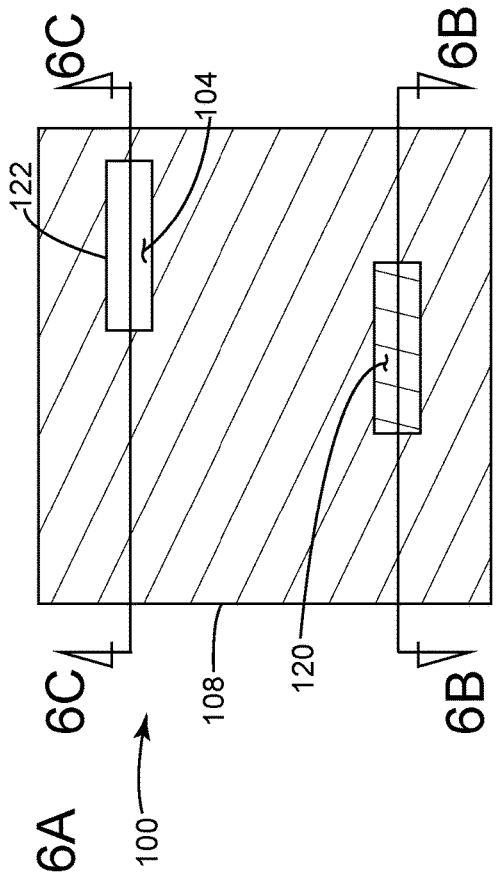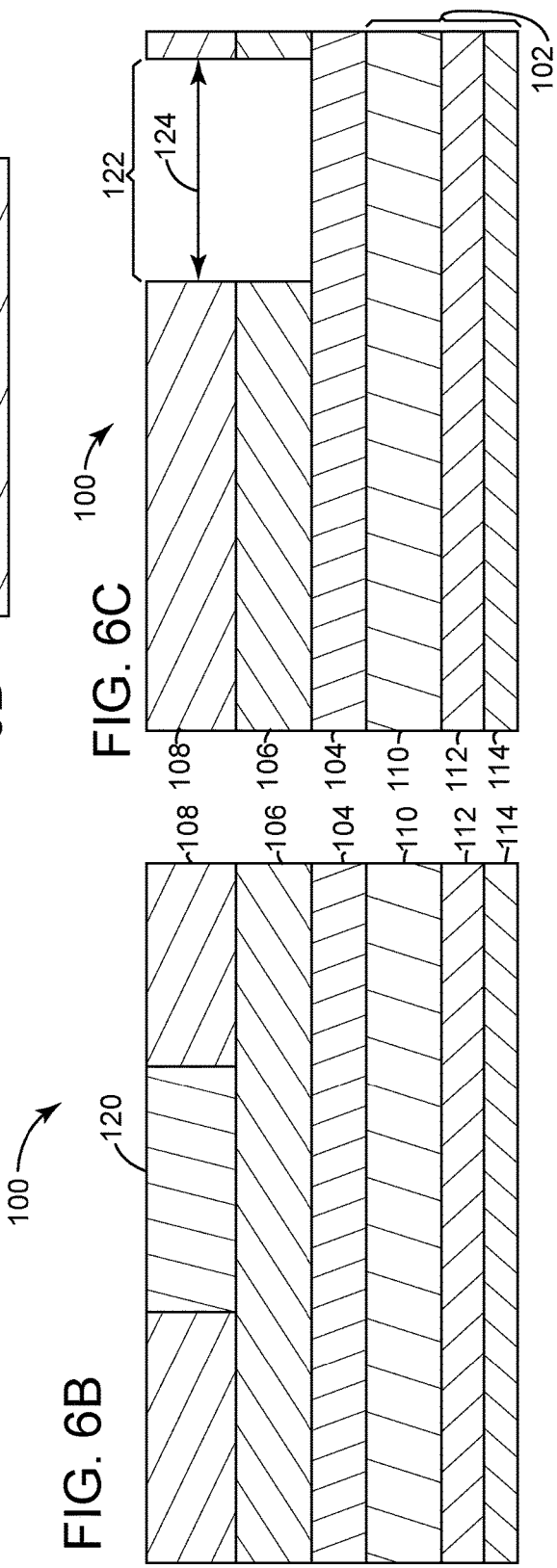

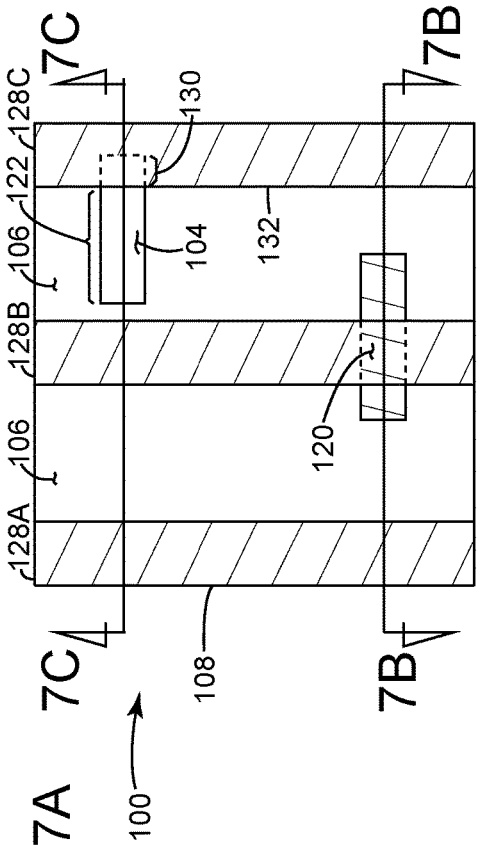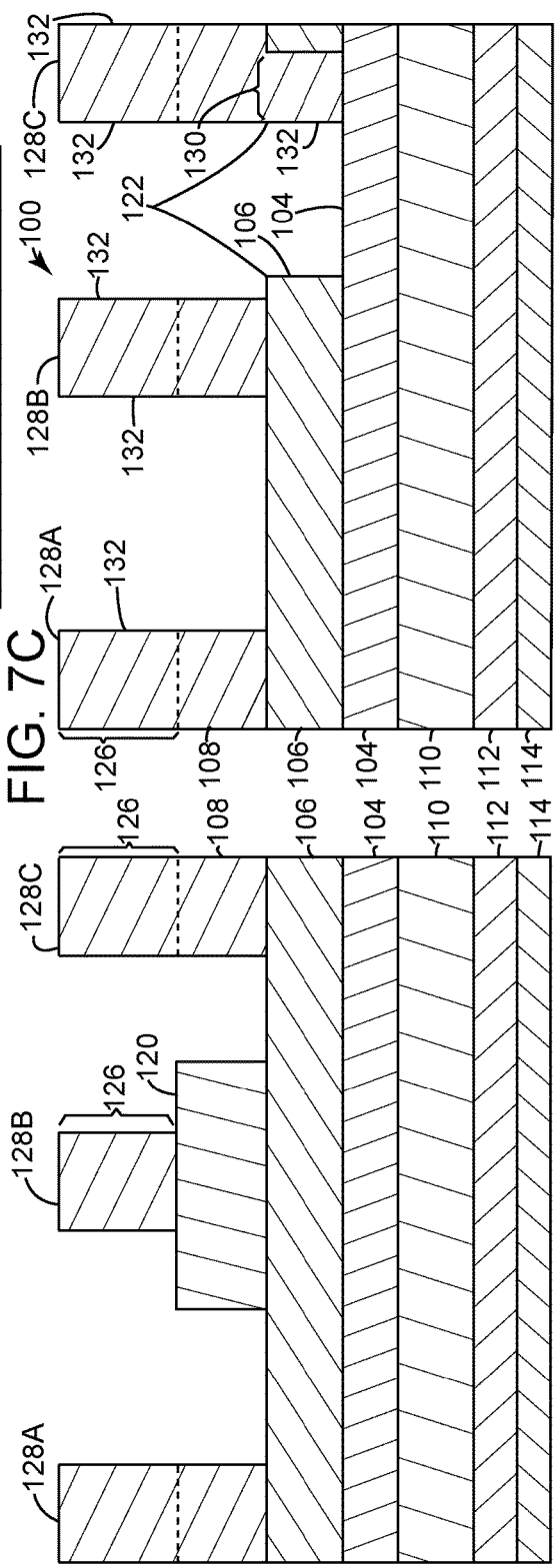

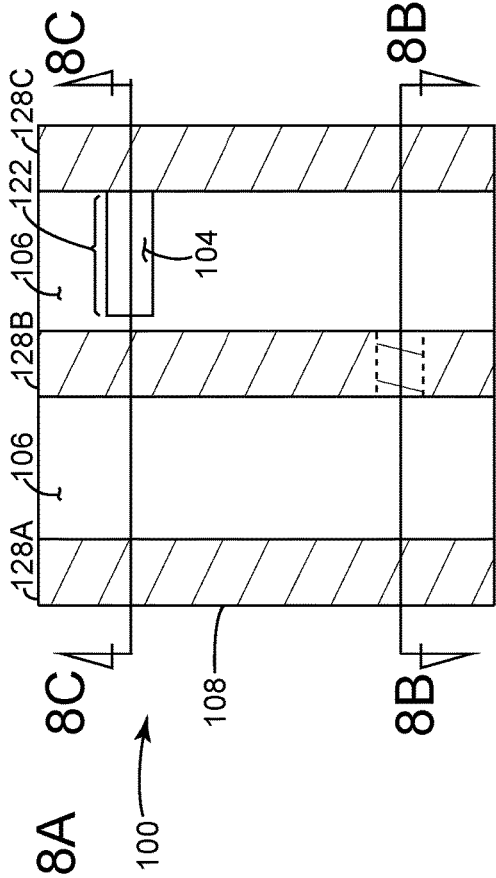
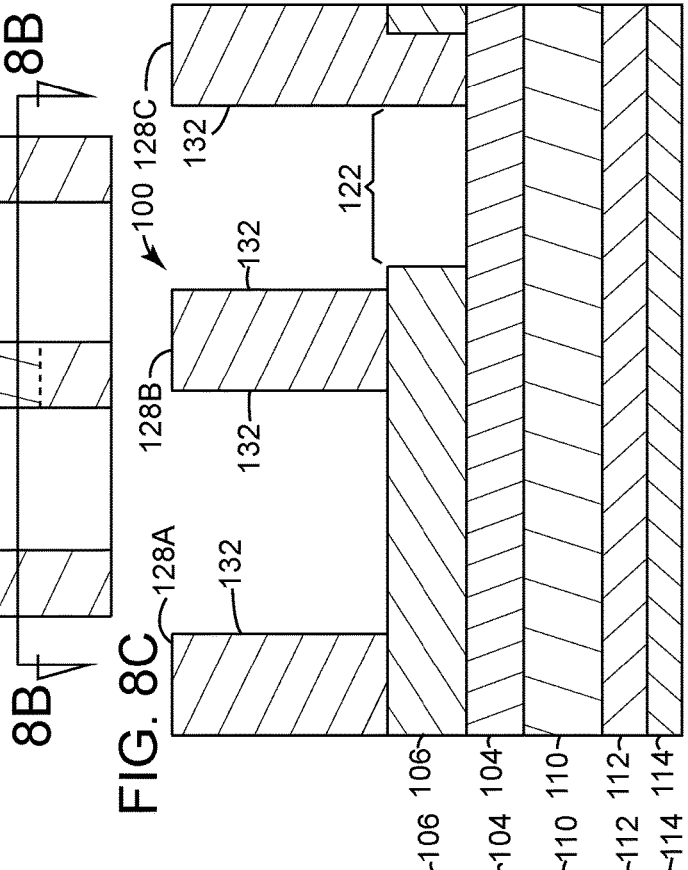
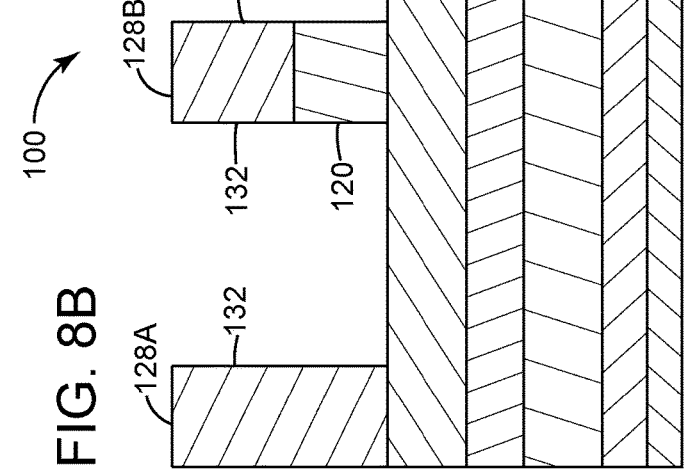
FIG. 8A
FIG. 8B
FIG. 8C

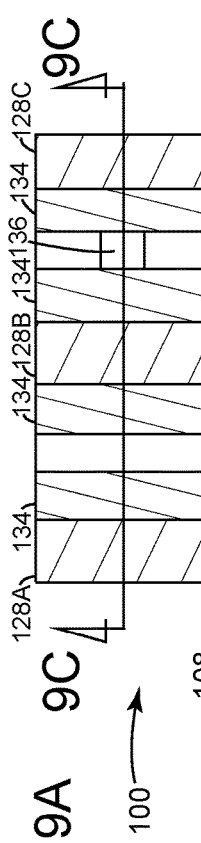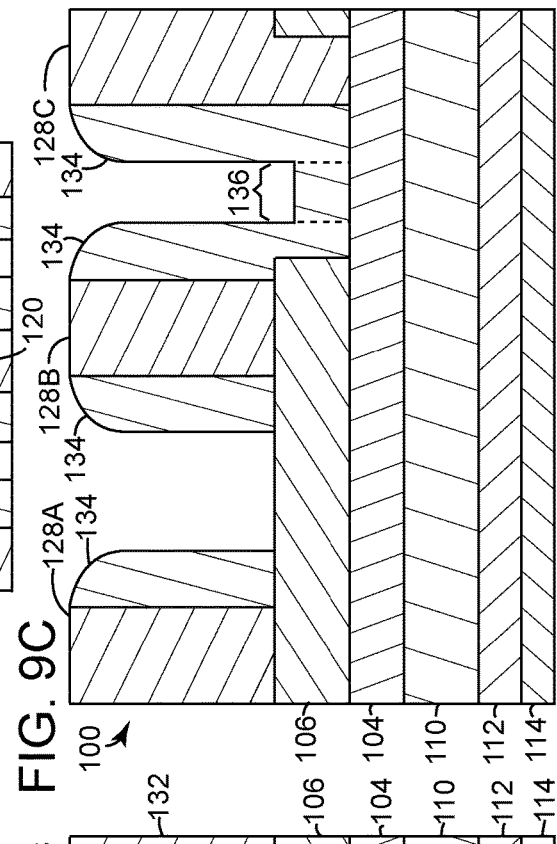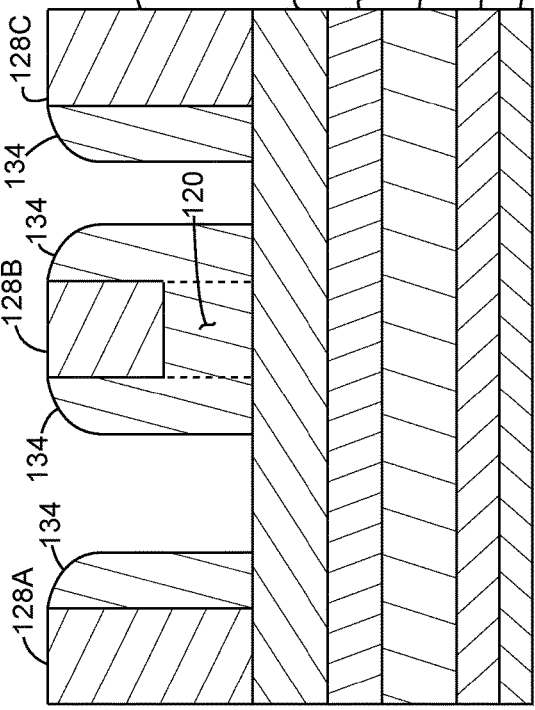

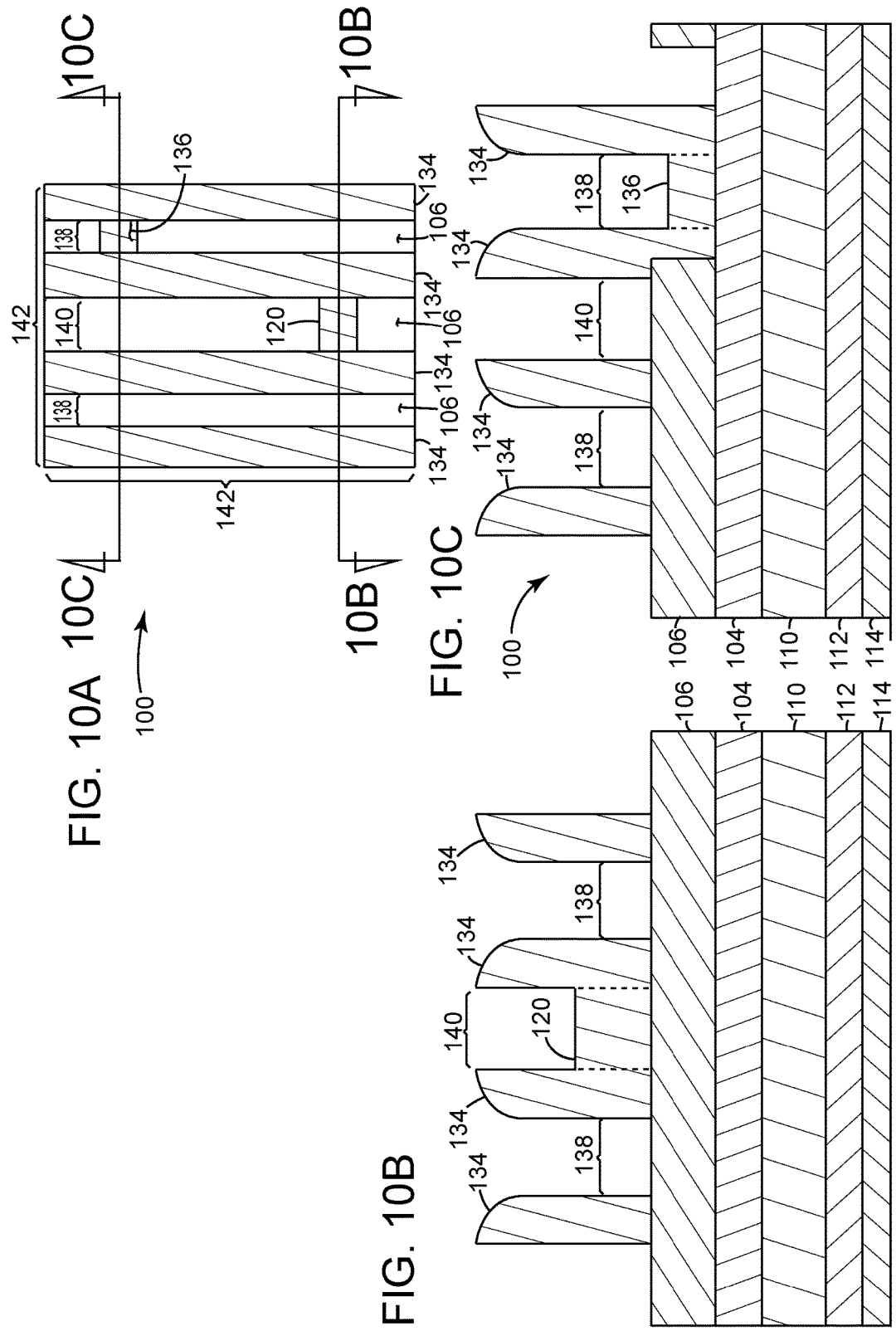

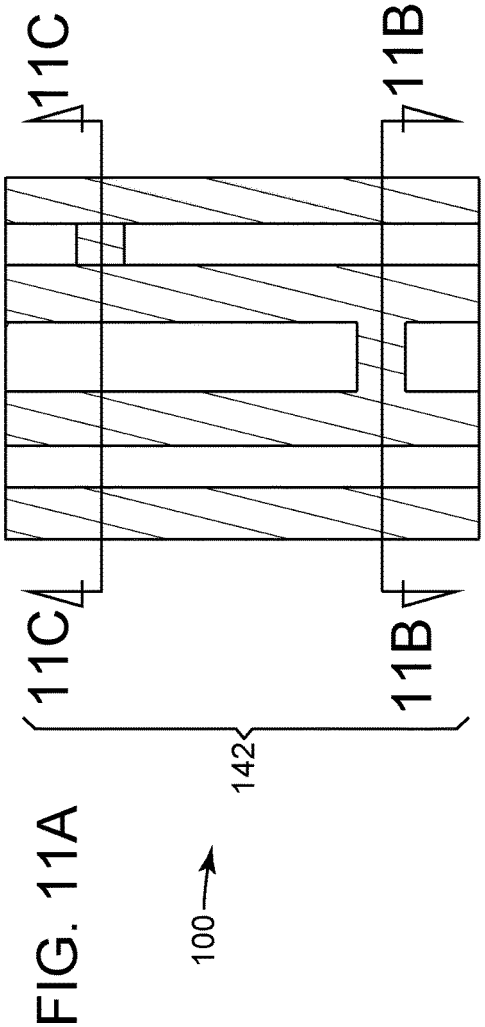
FIG. 11A
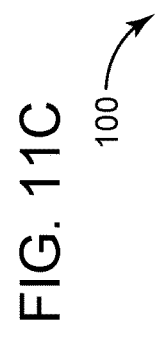
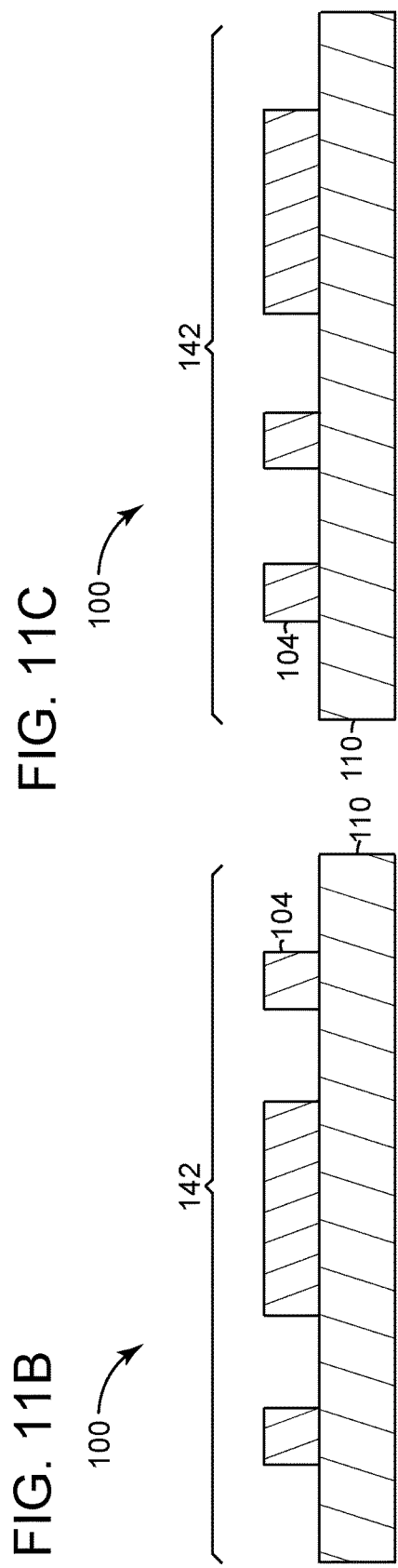
FIG. 11C
FIG. 11B

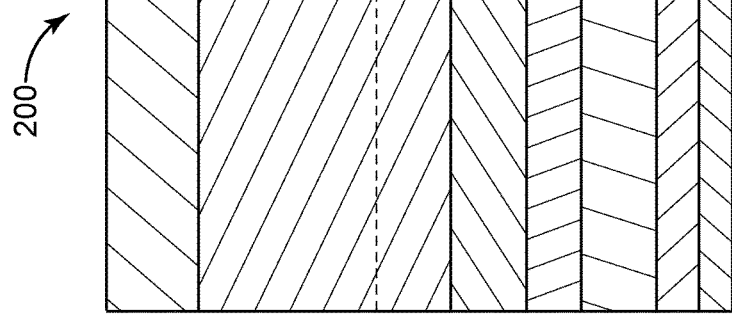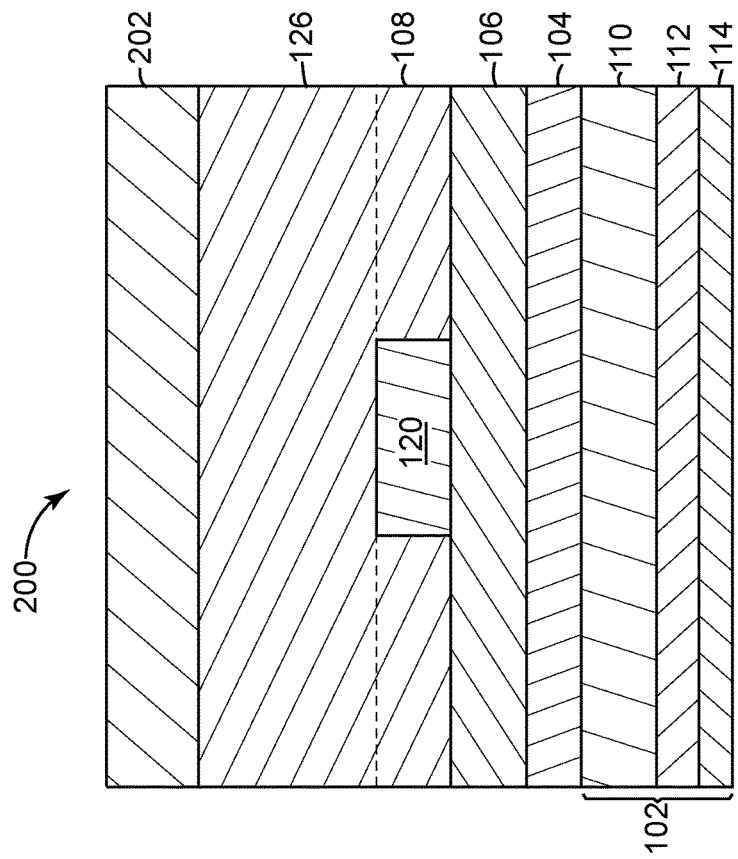

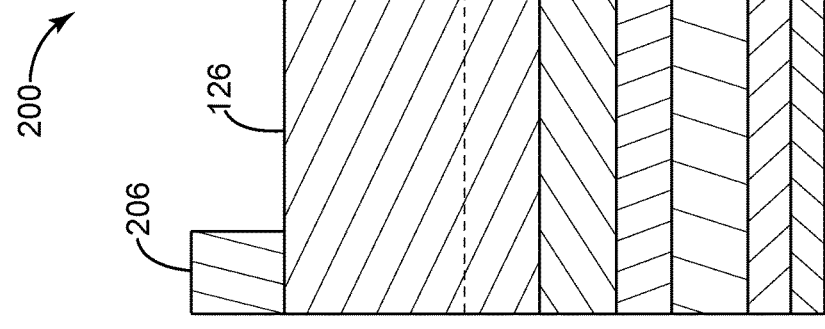
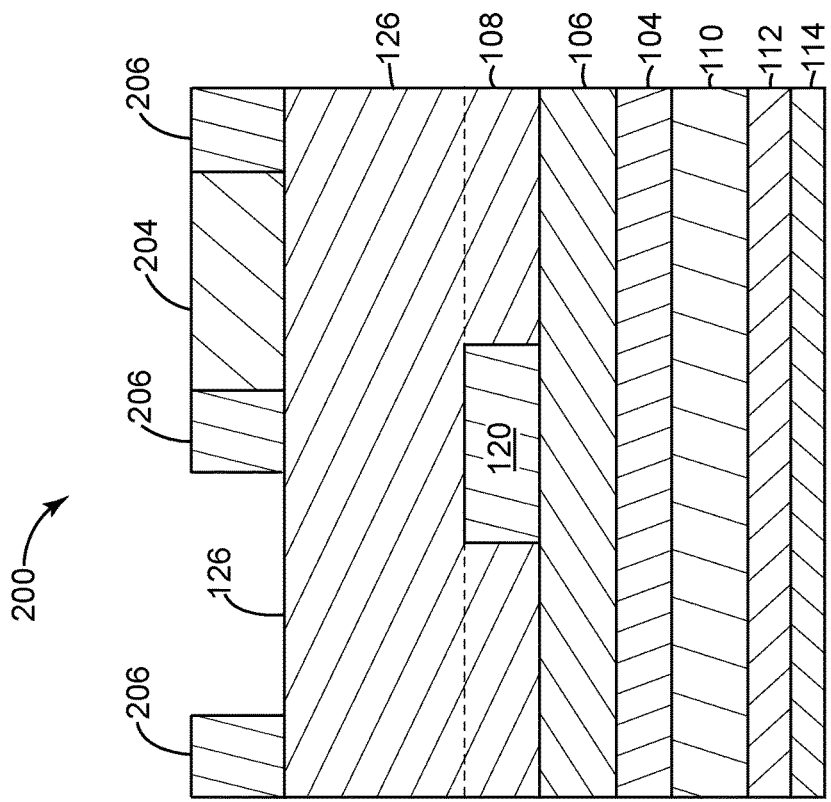

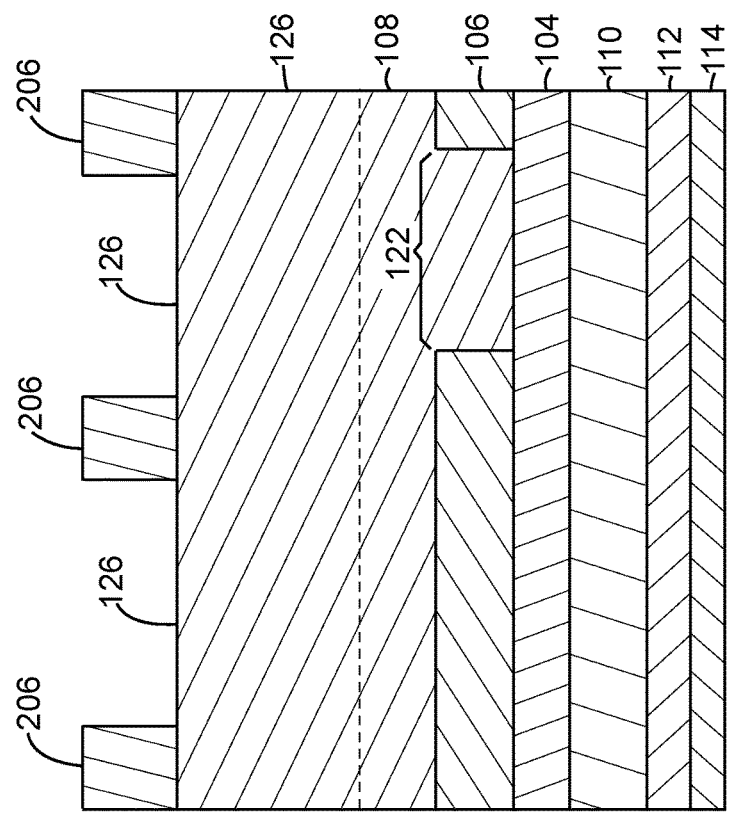
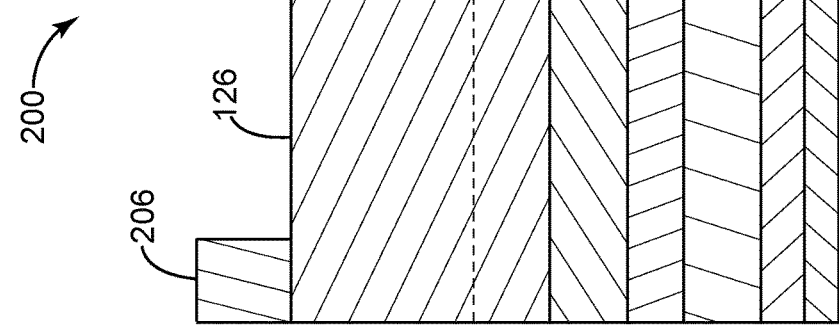
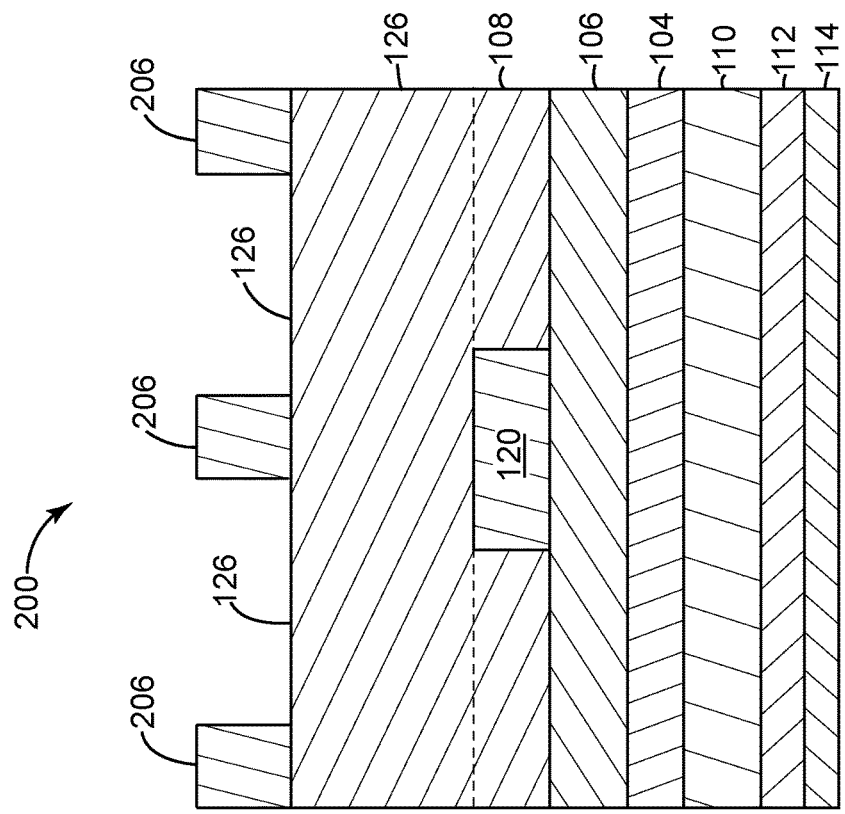

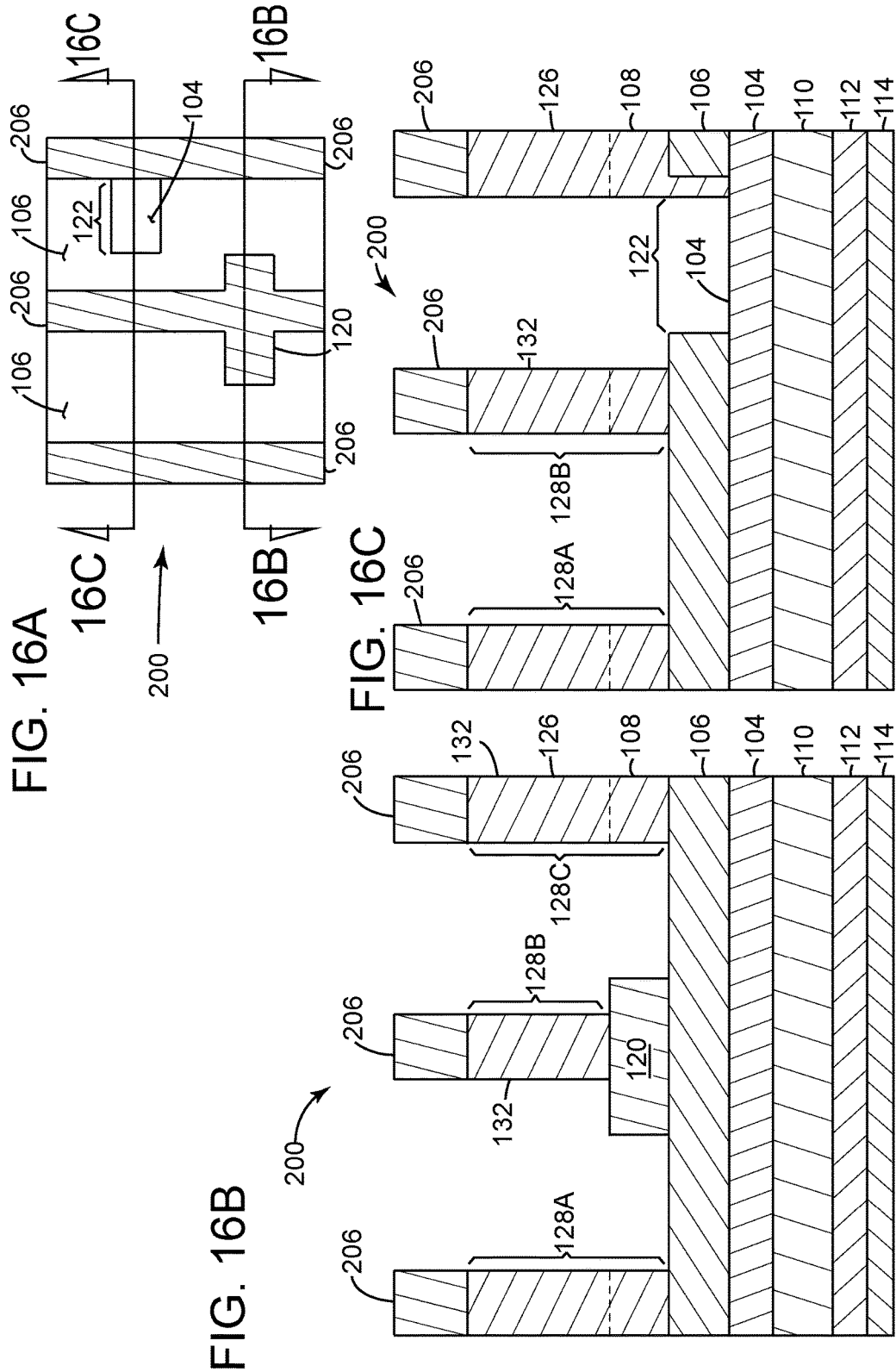

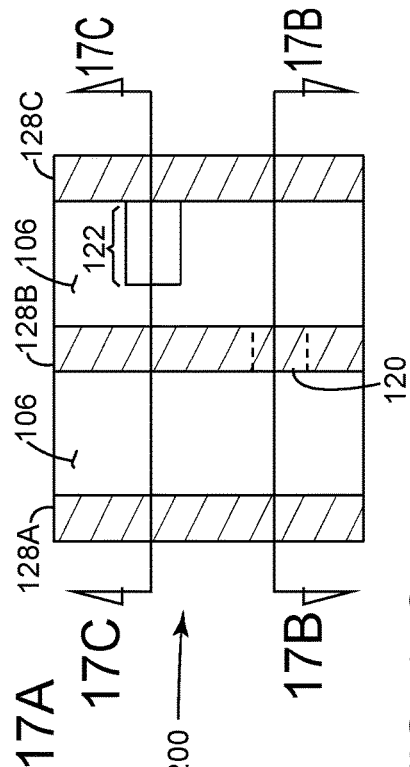
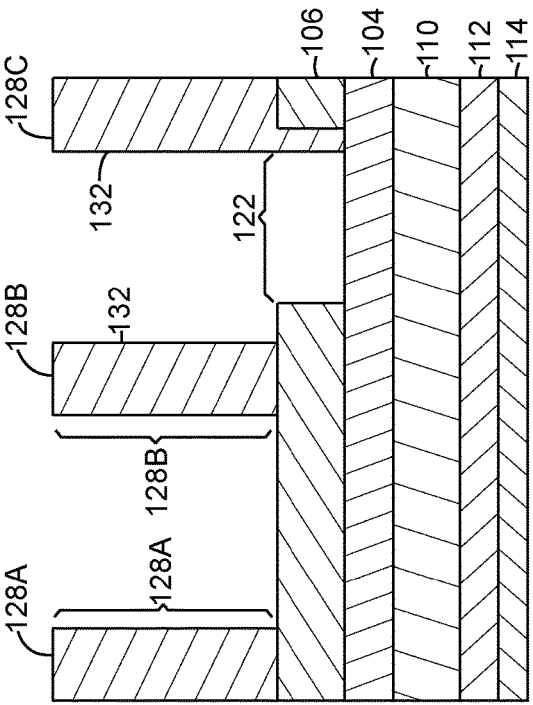
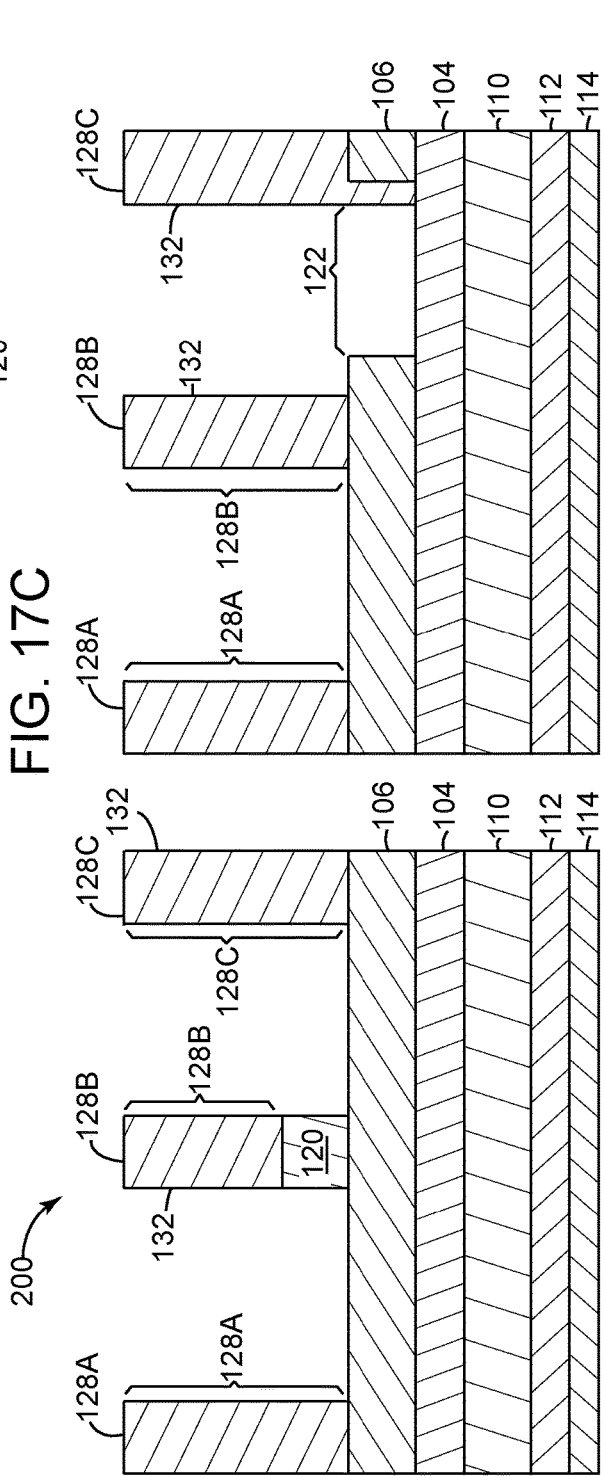

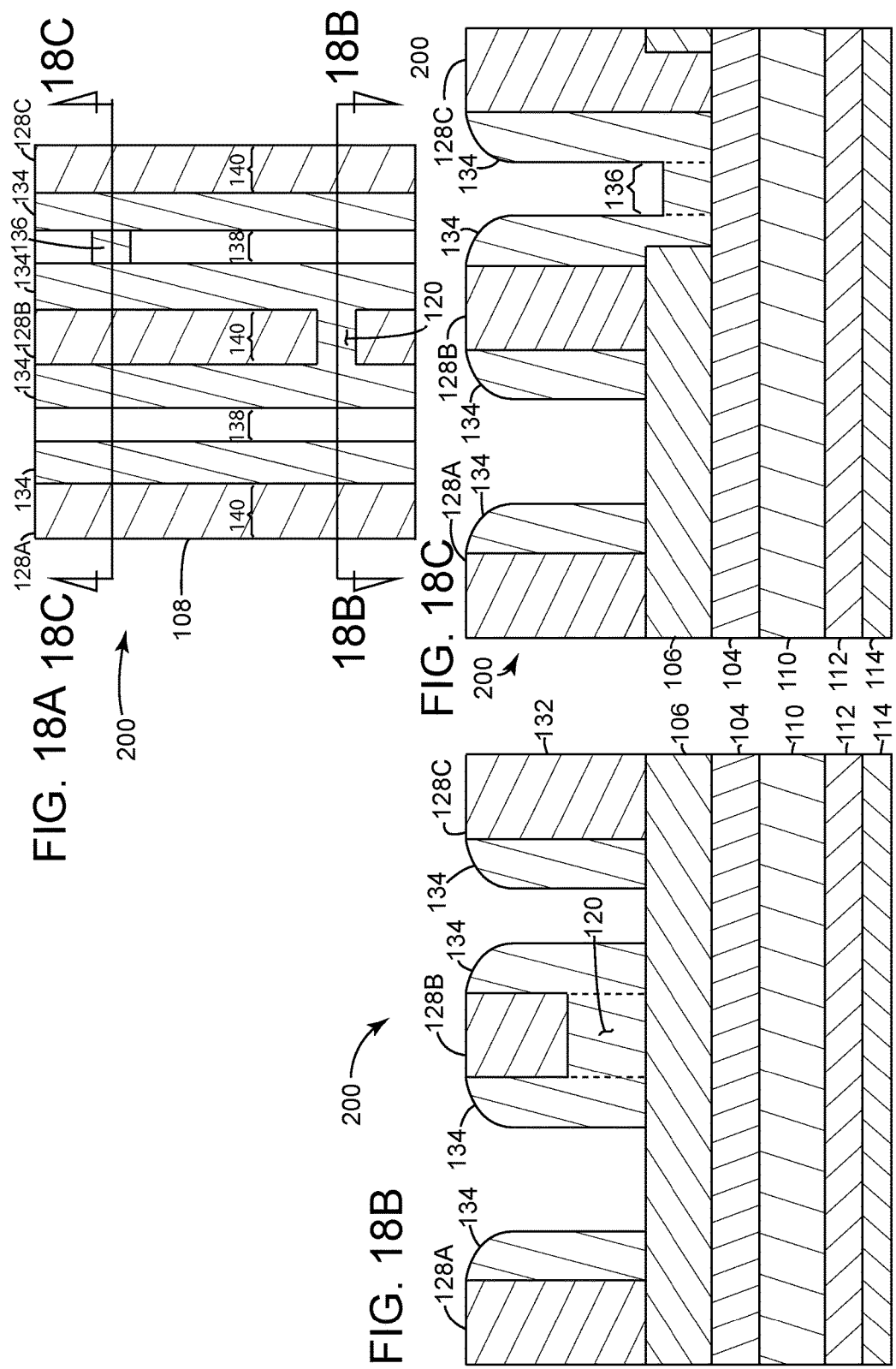

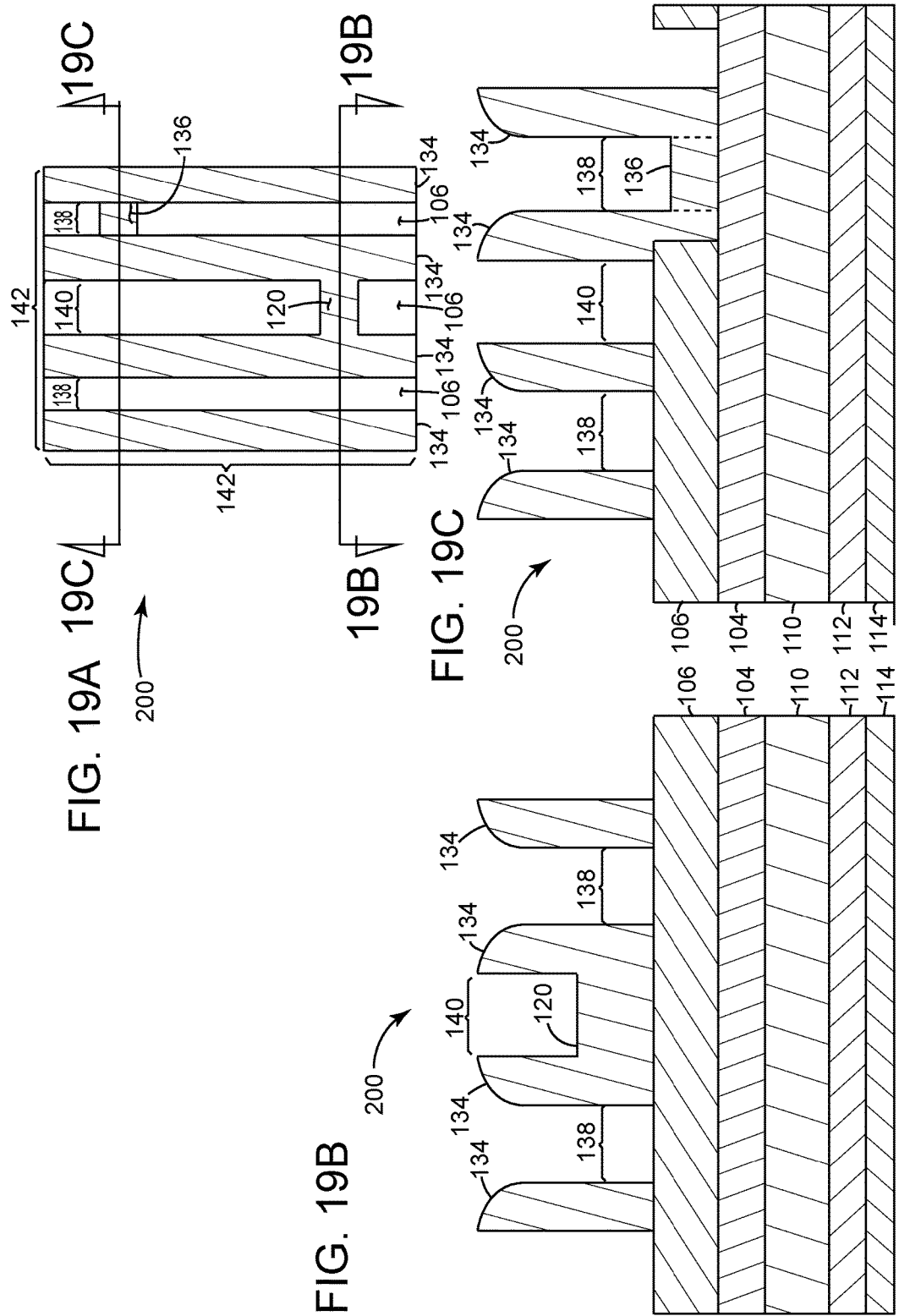

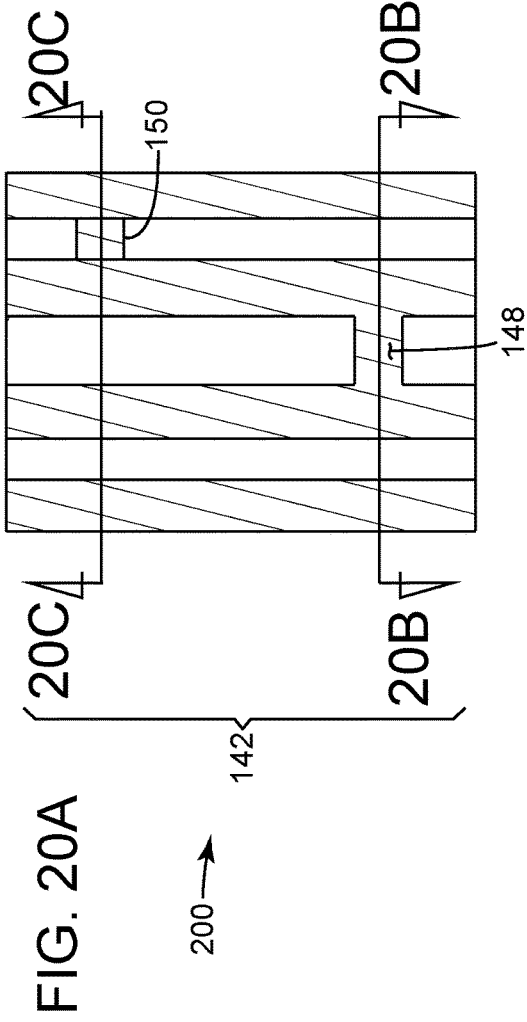
FIG. 20A
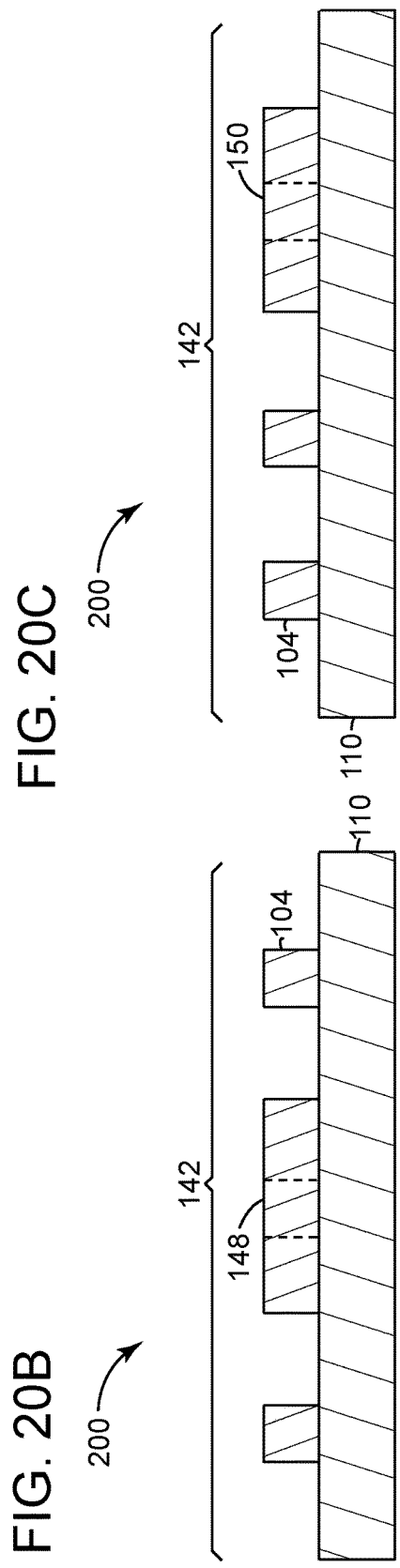
FIG. 20C
FIG. 20B

METHOD OF MAKING SELF-ALIGNED CONTINUITY CUTS IN MANDREL AND NON-MANDREL METAL LINES

TECHNICAL FIELD

The present invention relates to semiconductor devices and methods of making the same. More specifically, the invention relates to methods and apparatus for forming self-aligned continuity cuts in interconnection metal lines of a semiconductor structure.

BACKGROUND

With constant down-scaling and increasingly demanding requirements to the speed and functionality of ultra-high density integrated circuits, semiconductor devices, such as transistors, diodes, capacitors and the like, need ever more complex and densely packaged electrical interconnection systems between devices. Self-aligned multiple patterning (SAMP) techniques (such as self-aligned double patterning (SADP) or self-aligned quadruple patterning (SAQP)) are currently used to provide such electrical interconnection systems. These interconnection systems typically include multiple arrays of parallel metal lines disposed in several levels of dielectric layers. The dielectric layers are typically interconnected through a system of metalized vias. Conventionally, within an array of metal lines, the direction longitudinal, or parallel, to the metal lines is designated the "Y" direction and the direction perpendicular, or lateral, to the metal lines is designated the "X" direction.

Accordingly, as illustrated in exemplary prior art FIG. 1, at lower technology class sizes, such as the 10 nm class size or when the repetitive pitch distance is no greater than 40 nm, self-aligned multiple patterning processes are now used to provide an interconnection system 10 which includes multiple levels of arrays of parallel pairs of straight metalized trenches (or interconnect lines) 12 and 14 disposed in multiple dielectric layers 16. The multiple dielectric layers are connected with a system of vias, such that, once the trenches and vias are metallized, there is electrical continuity between levels of the interconnection system 10.

In order to provide device functionality, a plurality of prior art non-aligned continuity cuts (or dielectric blocks) 18 and 20, which block the electric continuity of neighboring interconnection lines 12 and 14, are patterned into the dielectric layer at specific locations to direct current flow between the dielectric layers 16 and devices. The prior art cuts 18 and 20 are patterned into the dielectric layer 16 through a series of lithographic processes. In the exemplary ideal case, as shown in FIG. 1, the lithographic processes are perfectly aligned such that cut 18 interrupts the precise active interconnect line 12 it is associated with, without extending into any neighboring interconnect line 14. Additionally cut 20 interrupts its interconnect line 14 without extending into any neighboring line 12.

Problematically, lithographic misalignment, or overlay, is a significant issue at lower technology node sizes, such as when the technology class size is no greater than 10 nm or when the repetitive pitch distance is no greater than 40 nm. Overlay is a measure of how well two lithographic layers (or steps) align. Overlay can be in the X or Y direction and is expressed in units of length.

In mass production, the lithographically disposed dielectric blocks (or continuity cuts) 18 and 20 must be large enough to make sure that they always cut the active line they are supposed to (i.e., lines 12 and 14 respectively) without clipping any neighboring lines, taking into account the overlay control for the worst 3 sigma case. In an exemplary worst 3 sigma case scenario, as shown in prior art FIG. 2, for at least the 10 nm class or less or for a pitch of 40 nm or less, the current state of the art 3 sigma overlay control is not precise enough to prevent continuity cuts 18 and 20 from over-extending into active neighboring lines in an acceptably few number of cases. That is, the failure rate of cuts 18 extending into adjacent lines 14 and cuts 20 extending into adjacent lines 12 will be outside of the industry acceptable 3 sigma standard.

The unwanted over-extension of cuts 18 (which are supposed to cut lines 12 only) into neighboring lines 14, and over-extension of cuts 20 (associated with lines 14) into neighboring lines 12 can, in the worst case condition, completely interrupt electrical continuity in the wrong line. Additionally, a line that is inadvertently only partially cut may still conduct for a time, but will over heat and prematurely fail.

Accordingly, there is a need for a method of forming continuity cuts in interconnection lines of a semiconductor structure that is tolerant of lithographic misalignment or overlay. Additionally, there is a need for a method that is capable of patterning continuity cuts between interconnection lines such that the cuts do not clip neighboring lines.

BRIEF DESCRIPTION

The present invention offers advantages and alternatives over the prior art by providing a method of forming mandrel and non-mandrel continuity cuts in interconnection lines of a semiconductor structure. The method can be used in at least an SADP or SAQP process.

A method in accordance with one or more aspects of the present invention includes providing a structure having a dielectric layer, a 1st hardmask layer, a 2nd hardmask layer and a 1st mandrel layer disposed respectively thereon. A 1st mandrel plug is disposed in the 1st mandrel layer. A 2nd mandrel layer is disposed over the 1st mandrel layer. The 1st and 2nd mandrel layers are etched to form a plurality 1st mandrels, wherein the 1st mandrel plug extends entirely through a single 1st mandrel. The 1st mandrel plug is etched such that it is self-aligned with sidewalls of the single 1st mandrel. The 1st mandrels are utilized to form mandrel metal lines in the dielectric layer. The 1st mandrel plug is utilized to form a self-aligned mandrel continuity cut in a single mandrel metal line formed by the single 1st mandrel.

Another method in accordance with one or more aspects of the present invention includes providing a structure having a dielectric layer, a 1st hardmask layer, a 2nd hardmask layer and a 1st mandrel layer disposed respectively thereon. A 2nd non-mandrel opening is disposed in the 2nd hardmask layer. A 2nd mandrel layer is disposed over the 1st mandrel layer. The 1st and 2nd mandrel layers are etched to form a plurality 1st mandrels, wherein the 2nd non-mandrel opening extends between a pair of adjacent 1st mandrels. First (1st) mandrel spacers are formed on sidewalls of the 1st mandrels. A 2nd non-mandrel plug is formed in the 2nd non-mandrel opening, wherein the 2nd non-mandrel plug is self-aligned with sidewalls of adjacent 1st mandrel spacers. The 1st mandrel spacers are utilized to form mandrel and non-mandrel metal lines within the dielectric layer. The 2nd non-mandrel plug is utilized to form a self-aligned 2nd non-mandrel continuity cut in one of the non-mandrel metal lines within the dielectric layer.

DRAWINGS

The invention will be more fully understood from the following detailed description taken in conjunction with the accompanying drawings, in which:

FIG. 1 is an exemplary embodiment of an ideal case prior art interconnection system with aligned continuity cuts;

FIG. 2 is an exemplary embodiment of a worst case prior art interconnection system with misaligned continuity cuts;

FIG. 4A is a side cross sectional view of FIG. 3 after a 1st mandrel opening is patterned into a 1st mandrel layer of the semiconductor structure in accordance with the present invention;

FIG. 4B is a top view of FIG. 4A taken along the line 4B-4B;

FIG. 5A is a side cross sectional view of FIG. 4A after a 1st mandrel plug has been disposed within 1st the mandrel opening in accordance with the present invention;

FIG. 5B is a top view of FIG. 5A;

FIG. 6A is a top view of FIG. 5A a 2nd non-mandrel opening has been patterned into a 2nd hardmask layer of the semiconductor structure in accordance with the present invention;

FIG. 6B is a side cross sectional view of FIG. 6A taken along the line 6B-6B;

FIG. 6C is a side cross sectional view of FIG. 6A taken along the line 6C-6C;

FIG. 7A is a top view of FIG. 6A after 1st mandrels have been formed thereon in accordance with the present invention;

FIG. 7B is a side cross sectional view of FIG. 7A taken along the line 7B-7B;

FIG. 7C is a side cross sectional view of FIG. 7A taken along the line 7C-7C;

FIG. 8A is a top view of FIG. 7A after the 1st mandrel plug has been RIE etched in accordance with the present invention;

FIG. 8B is a side cross sectional view of FIG. 8A taken along the line 8B-8B;

FIG. 8C is a side cross sectional view of FIG. 8A taken along the line 8C-8C;

FIG. 9A is a top view of FIG. 8A after formation of 1st mandrel spacers in accordance with the present invention;

Figure 12A:
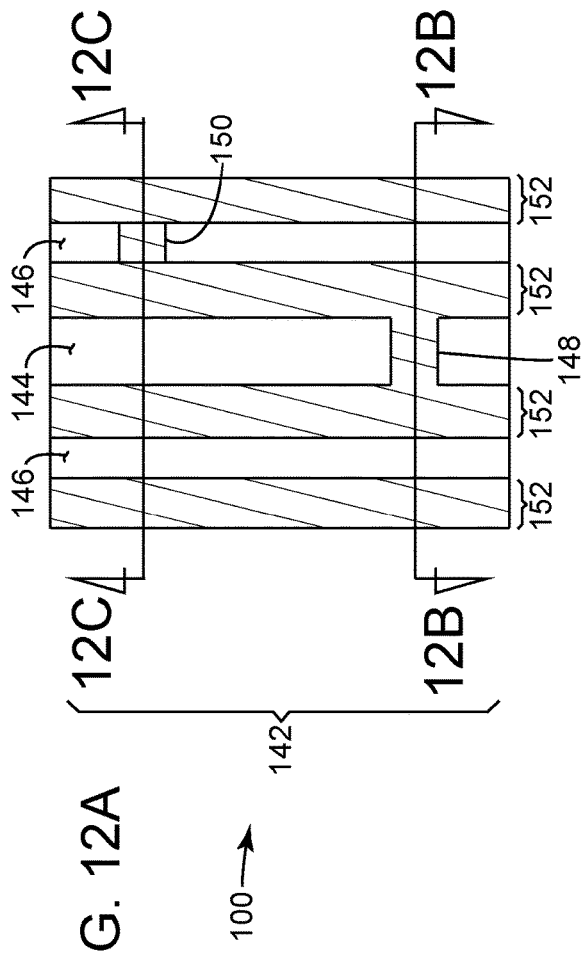
Figure 12C:
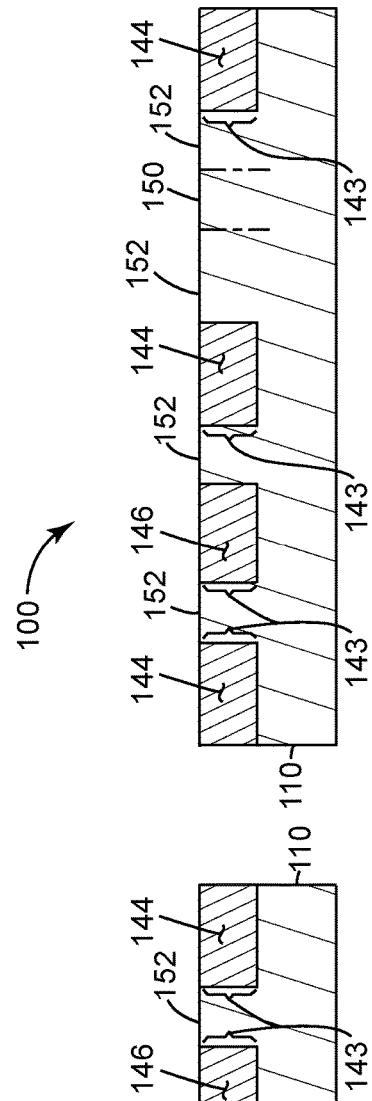
Figure 12B:
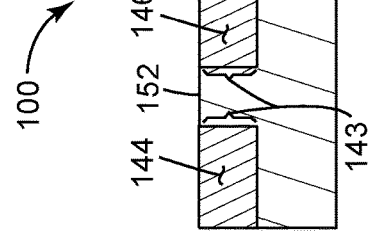
Figure 13A:
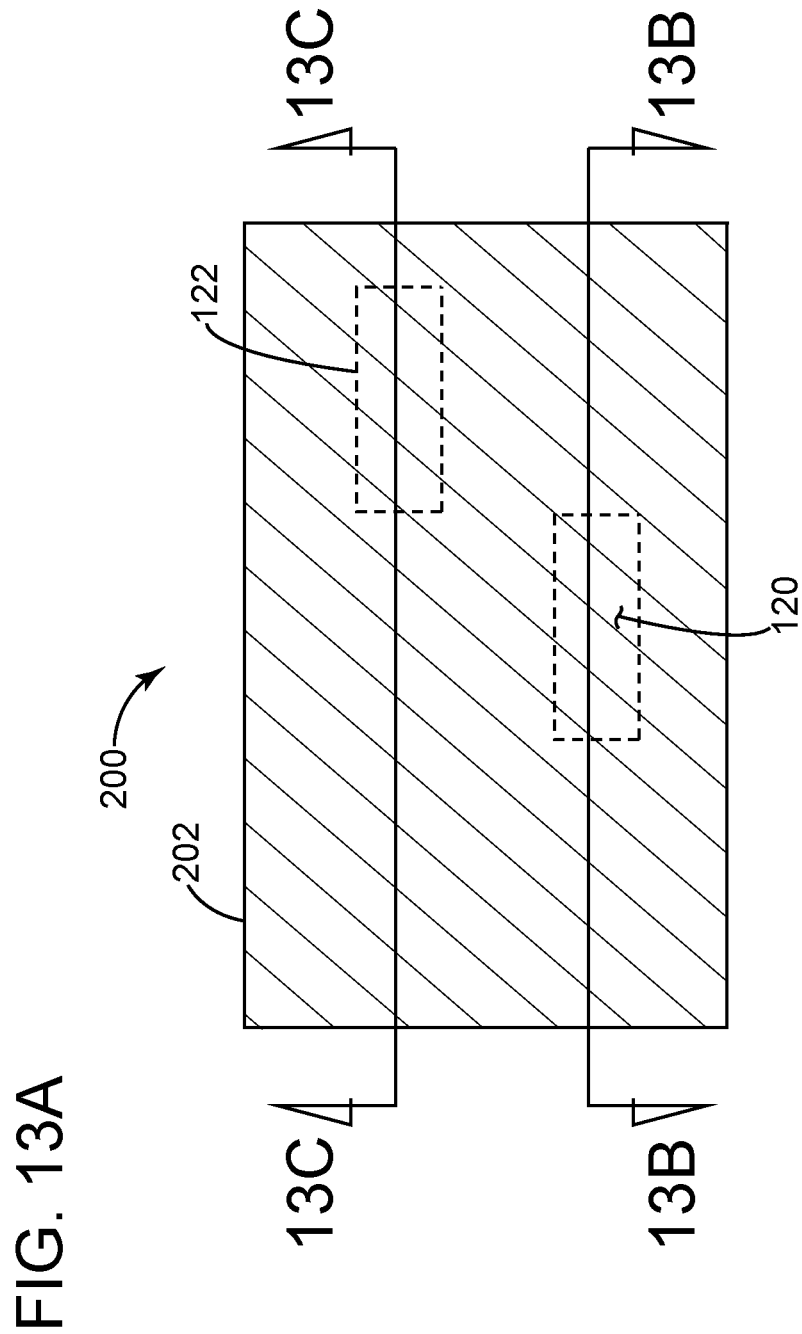
Figure 14A:
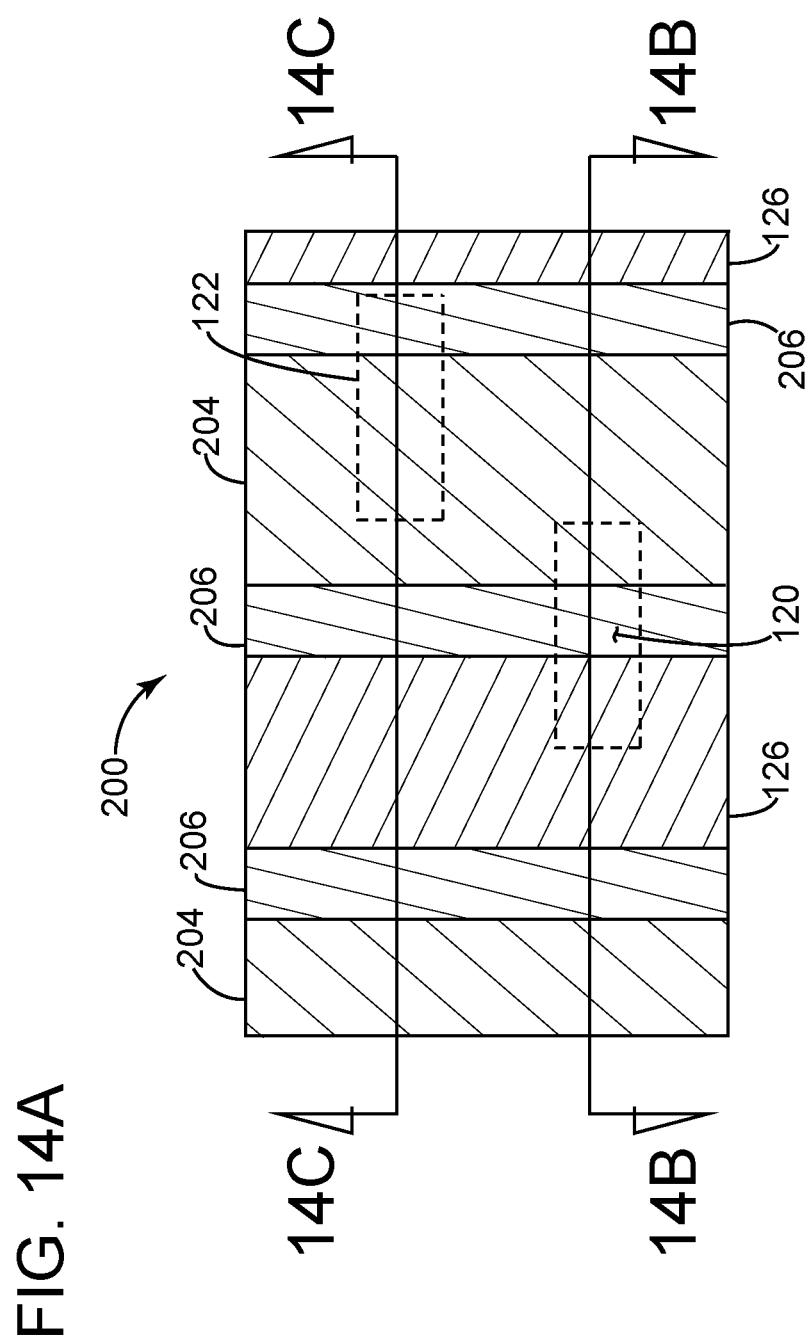
Figure 15A:
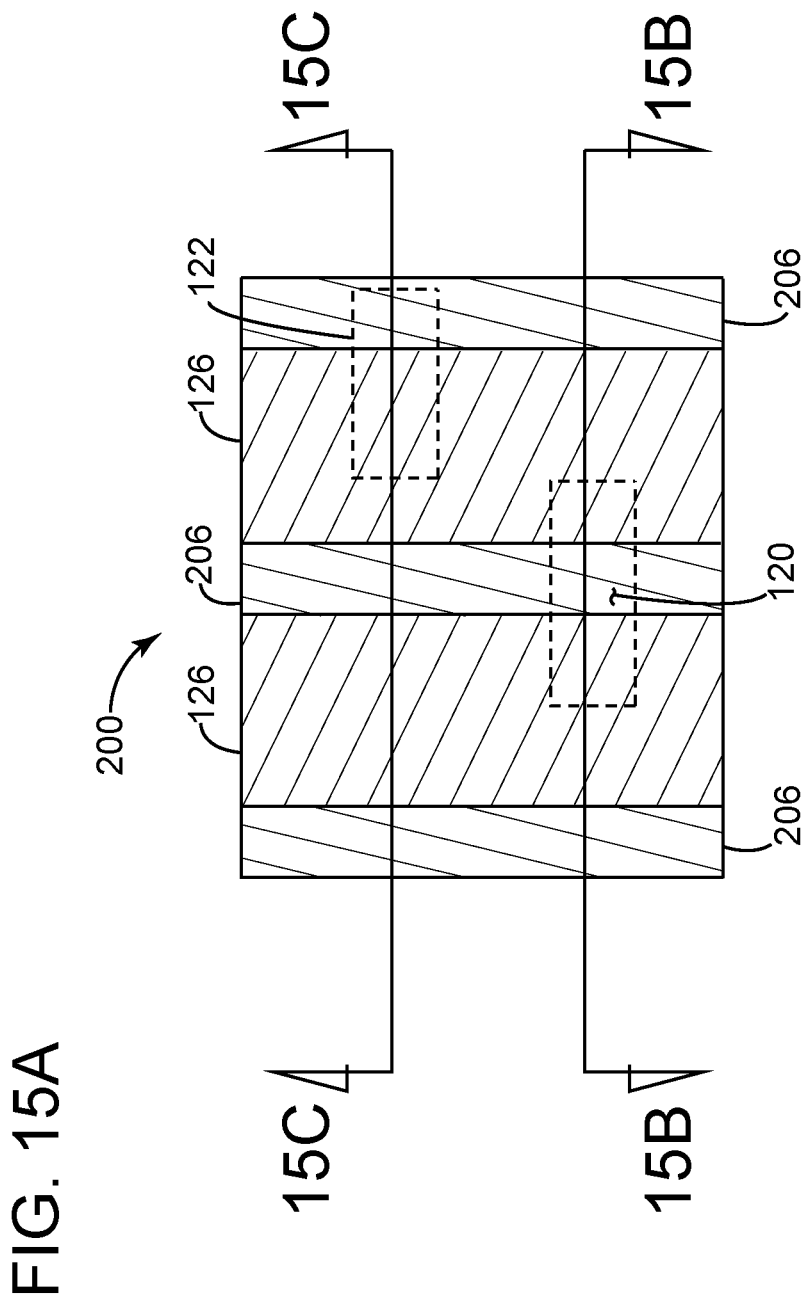
Figure 21A:
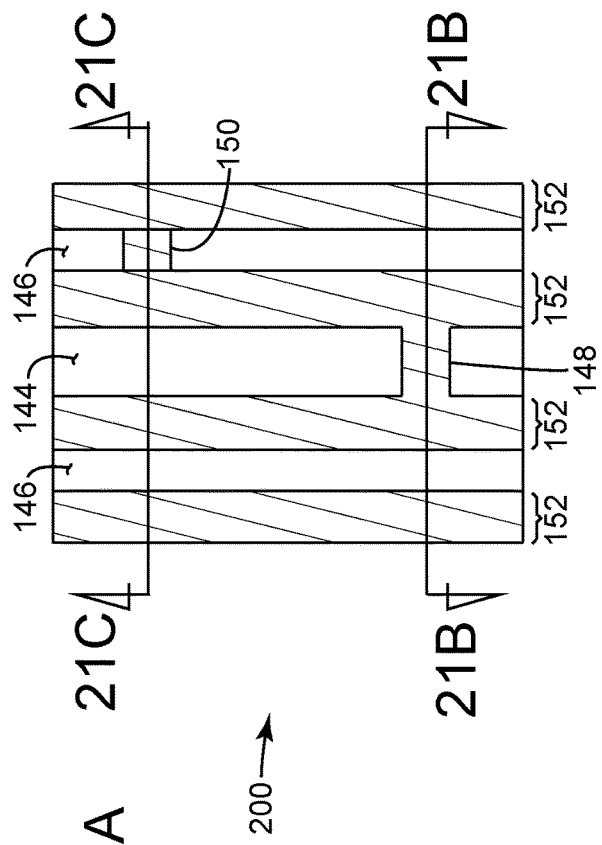
Figure 21C:
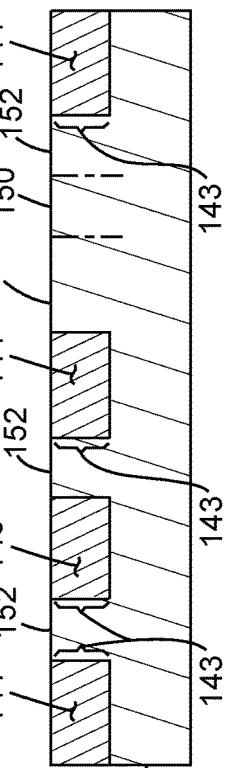
Figure 21B:
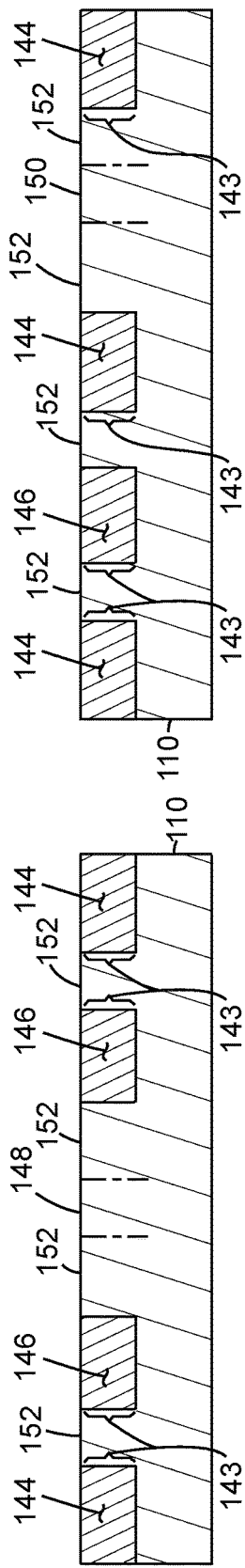

FIG. 9B a side cross sectional view of FIG. 9A taken along the line 9B-9B;

FIG. 9C a side cross sectional view of FIG. 9A taken along the line 9C-9C;

FIG. 10A is a top view of FIG. 9A after the 1st mandrels have been removed in accordance with the present invention;

FIG. 10B is a side cross sectional view of FIG. 10A taken along the line 10B-10B;

FIG. 10C is a side cross sectional view of FIG. 10A taken along the line 10C-10C;

FIG. 11A is a top view of FIG. 10A after a metal line pattern has been etched down into a 1st hardmask layer of the semiconductor structure in accordance with the present invention;

FIG. 11B is a side cross sectional view of FIG. 11A taken along the line 11B-11B;

FIG. 11C is a side cross sectional view of FIG. 11A taken along the line 11C-11C;

FIG. 12A is a top view of FIG. 11A after the metal line pattern has been etched and metalized into a dielectric layer of the semiconductor structure;

FIG. 12B is a side cross sectional view of FIG. 12A taken along the line 12B-12B;

FIG. 12C a side cross sectional view of FIG. 12A taken along the line 12C-12C;

FIG. 13A is a simplified top view of an alternative exemplary embodiment of a semiconductor structure for an integrated circuit device at an intermediate stage of manufacturing in accordance with the present invention;

FIG. 13B is a side cross sectional view of FIG. 13A taken along the line 13B-13B;

FIG. 13C is a side cross sectional view of FIG. 13A taken along the line 13C-13C;

FIG. 14A is a top view of FIG. 13A after 2nd mandrels and 2nd mandrel spacers are formed thereon in accordance with the present invention;

FIG. 14B is a side cross sectional view of FIG. 14A taken along the line 14B-14B;

FIG. 14C is a side cross sectional view of FIG. 14A taken along the line 14C-14C;

FIG. 15A is a top view of FIG. 14A after the 2nd mandrels have been removed in accordance with the present invention;

FIG. 15B is a side cross sectional view of FIG. 15A taken along the line 15B-15B;

FIG. 15C is a side cross sectional view of FIG. 15A taken along the line 15C-15C;

FIG. 16A is a top view of FIG. 15A after 1st mandrels have been formed thereon in accordance with the present invention;

FIG. 16B is a side cross sectional view of FIG. 16A taken along the line 16B-16B;

FIG. 16C is a side cross sectional view of FIG. 16A taken along the line 16C-16C;

FIG. 17A is a top view of FIG. 16A after the 2nd mandrel spacers and the 1st mandrel plug have been etched in accordance with the present invention;

FIG. 17B is a side cross sectional view of FIG. 17A taken along the line 17B-17B;

FIG. 17C is a side cross sectional view of FIG. 17A taken along the line 17C-17C;

FIG. 18A is a top view of FIG. 17A after formation the 1st mandrel spacers in accordance with the present invention;

FIG. 18B is a side cross sectional view of FIG. 18A taken along the line 18B-18B;

FIG. 18C is a side cross sectional view of FIG. 18A taken along the line 18C-18C;

FIG. 19A is a top view of FIG. 18A after the 1st mandrels have been removed in accordance with the present invention;

FIG. 19B is a side cross sectional view of FIG. 19A taken along the line 19B-19B;

FIG. 19C is a side cross sectional view of FIG. 19A taken along the line 19C-19C;

FIG. 20A is a top view of FIG. 19A after the metal line pattern has been etched down into the 1st hardmask layer in accordance with the present invention;

FIG. 20B is a side cross sectional view of FIG. 20A taken along the line 20B-20B;

FIG. 20C is a side cross sectional view of FIG. 20A taken along the line 20C-20C;

FIG. 21A is a top view of FIG. 20A after the metal line pattern has been etched and metalized into the dielectric layer in accordance with the present invention;

FIG. 21B is a side cross sectional view of FIG. 21A taken along the line 21B-21B; and FIG. 21C is a side cross sectional view of FIG. 21A taken along the line 21C-21C.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 3-12C illustrate an exemplary embodiment of a method of making self-aligned continuity cuts in mandrel and non-mandrel metal lines for integrated circuits in accordance with the present invention. In this embodiment the method in accordance with the present invention is applied to a self-aligned double patterning (SADP) process.

Figure 3:
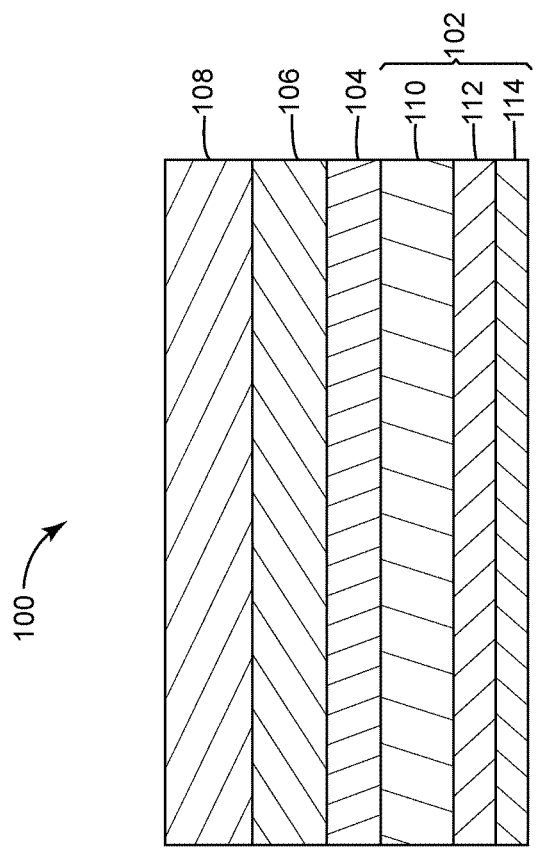
FIG. 3 is a simplified cross sectional side view of an exemplary embodiment of a semiconductor structure for an integrated circuit device at an intermediate stage of manufacturing in accordance with the present invention.

Referring to FIG. 3, a simplified cross sectional side view of an exemplary embodiment of a structure 100 for an integrated circuit device in accordance with the present invention is presented at an intermediate stage of manufacturing. Structure 100 includes a dielectric stack 102 upon which is disposed (from bottom to top) a first (1st) hardmask layer 104, a second (2nd) hardmask layer 106 and a 1st mandrel layer 108 respectively. In this embodiment, the 1st hardmask layer is composed of titanium nitride (TiN), the 2nd hardmask layer is composed of silicon nitride (SiN) and the 1st mandrel layer is composed of an amorphous silicon (aSi).

The dielectric stack 102 may include many different combinations of stacks of layers depending on such factors as application requirements, cost, design preferences and the like. In this exemplary embodiment, the dielectric stack 102 includes a dielectric layer 110, an etch stop layer 112 and a stack of buried layers 114. The dielectric layer 110 may be composed of a dielectric isolation material such as a low K or ultra low K (ULK) material or various combinations of silicon, carbon, oxygen and hydrogen (an SiCOH layer). The etch-stop layer 112 may be composed of a silicon nitride (SiN) or similar. The buried layers 114 may be a complex stack of layers from the substrate (not shown) upwards. It is in the dielectric layer 110 that interconnect lines 144, 146 and associated self-aligned continuity cuts 148, 150 (best seen in FIGS. 12A, B and C) will eventually be disposed in accordance with the present invention.

Referring to FIG. 4A, a side cross sectional view of FIG. 3 after a 1st mandrel opening 116 is patterned into the mandrel layer 108 is presented. Referring also to FIG. 4B, a top view of FIG. 4A taken along the line 4B-4B is additionally presented.

Next in the process flow, a 1st mandrel opening 116 is patterned into the mandrel layer 108 through well-known lithographic processes. For example, a lithographic (litho) stack of layers (not shown) may be first disposed over the mandrel layer 108. The litho stack can be composed of several different kinds of layers, depending on such parameters as the application requirements, design or proprietary preferences or the like. One such stack of layers includes a stack of four thin films which includes (from bottom to top) an SOH layer, a SiON cap layer, a bottom antireflective coating (BARC) layer, and a top resist layer.

Once the litho stack is disposed over the mandrel layer 108, the 1st mandrel opening 116 can be patterned into the resist layer of the litho stack through well-known lithographic techniques. The 1st mandrel opening 116 can next be patterned down to the mandrel layer.

For purposes of clarity, any feature herein, such as a spacer, a trench, an opening, a plug, a mandrel or the like, that is etched down (i.e., formed or patterned) from an original feature, will be referred to as such original feature if it has the same form and function as the original feature. However, it is well-known that the etched down feature will be a translation of the original feature and will be composed of remnants of the various layers involved in the etching process.

As will be explained in greater detail herein, the mandrel opening 116 is located in a predetermined position to form a continuity cut 148 in a mandrel line 144 disposed in the dielectric layer 110 (best seen in FIGS. 12A, B, C). The mandrel opening 116 has a predetermined length 118 in the X direction (i.e., in the direction perpendicular to the mandrel metal lines 144) that is long enough to form the continuity cut 148 in the mandrel line 144 even under worst case tolerance misalignment conditions.

Referring to FIGS. 5A and 5B, a side cross sectional view (FIG. 5A) and a top view (FIG. 5B) of FIG. 4A after a 1st mandrel plug 120 has been disposed within the mandrel opening 116 is presented. Next in the process flow, a 1st mandrel plug 120 is disposed in the 1st mandrel opening by such means as chemical vapor deposition (CVD), physical vapor deposition (PVD), atomic layer deposition (ALD) or similar. Any overflow or excess material from the deposition process may then be planarized down to the top surface of the 3rd hardmask layer 108 by such means as chemical mechanical polishing (CMP) or the like.

It is important to note that the 1st mandrel plug 120 is desirably composed of the same or similar material as that of 1st mandrel spacers 134 (best seen in FIG. 9A, B, C), which will be formed on sidewalls of mandrels 128 later in the process flow. This is because both the 1st mandrel spacers 134 and the mandrel plug 120 will need to be selectively etched relative to the mandrels 128. In this particular embodiment, the 1st mandrel plug 120 is composed of an oxide material such as SiO2. Referring to FIG. 6A, a top view of FIG. 5A is presented after a 2nd non-mandrel opening 122 has been patterned into structure 100. Referring also to FIG. 6B a side cross sectional view of FIG. 6A taken along the line 6B-6B is presented. Referring also to FIG. 6C a side cross sectional view of FIG. 6A taken along the line 6C-6C is presented.

Next in the process flow, a 2nd non-mandrel opening 120 is patterned into both the 1st mandrel layer 108 and SiN 2nd hardmask layer 106. Again, this can be done through well-known lithographic processes in similar fashion to that of patterning the 1st mandrel opening 116.

As will be explained in greater detail herein, the non-mandrel opening 120 is located in a predetermined position to form a continuity cut 150 in a non-mandrel line 146 disposed in the dielectric layer 110 (best seen in FIGS. 12A, B, C). The non-mandrel opening 116 has a predetermined length 124 in the X direction that is long enough to form the continuity cut 150 in the non-mandrel line 146 even under worst case tolerance misalignment conditions.

Referring to FIG. 7A, a top view of FIG. 6A after 1st mandrels 128 have been formed thereon is presented. Referring also to FIG. 7B a side cross sectional view of FIG. 7A taken along the line 7B-7B is presented. Referring also to FIG. 7C a side cross sectional view of FIG. 7A taken along the line 7C-7C is presented.

Next in the process flow, a 2nd mandrel layer 126 is disposed over the 1st mandrel layer 108 of structure 100. Then 1st mandrels 128A, B and C (collectively referred to herein as 128) are formed into the combined 1st and 2nd mandrel layers 108, 126 through an anisotropic etching process, such as a reactive ion etching (RIE) process or similar. The mandrels 128 have substantially vertical sidewalls 132. For illustrative purposes, only three mandrels 128A, B, C are shown. However, any number of mandrels 128 can be formed by this process.

Referring more specifically to FIGS. 7A and 7C, it can be seen that, due to lithographic tolerances, the non-mandrel opening 122 has an overextension portion 130 which extends beyond the predetermined location of sidewall 132 of mandrel 128C. As such, during the formation of mandrels 128, the overextension portion 130 is covered and aligned with the mandrel 128C. This would be the case for any overextension portion 130 of any non-mandrel opening 122 that overextends beyond any sidewall 132 of any mandrel 122. Therefore, it can be said that at this stage of the process flow, the 2nd non-mandrel opening 122 is self-aligned with the sidewalls 132 of the mandrels 128.

Referring to FIG. 8A, a top view of FIG. 7A after 1st mandrel plug have been RIE etched is presented. Referring also to FIG. 8B a side cross sectional view of FIG. 8A taken along the line 8B-8B is presented. Referring also to FIG. 8C a side cross sectional view of FIG. 8A taken along the line 8C-8C is presented.

Next in the process flow, the oxide mandrel plug 120 is anisotropically etched relative to the aSi mandrels 128 to self-align the plug 120 with the sidewalls 132 of the mandrels 128. More specifically, the 1st mandrel plug 120 was subjected to a RIE process to self-align the plug 120 with the sidewalls 132 of mandrel 128B.

For purposes herein, self-aligning a first feature (such as an opening, a plug, a continuity cut or the like) to a second feature (such as a mandrel sidewall, a spacer sidewall, edges of metal lines or similar) means aligning the distal ends of the first feature to specific edges or surfaces of the second feature during the process flow. As such, the second feature defines a structural boundary beyond which the first feature cannot extend or be disposed by the design of the process flow. For example, in the case of the plug 120 as illustrated in FIG. 7B, the distal ends of the plug 120 can extend beyond the edges of mandrel 128B due to lithographic tolerances. However, as illustrated in FIG. 8B, the selective RIE etch process removes only the portions of the plug 120 that extends beyond the sidewalls 132 of mandrel 128B, leaving the distal ends of plug 120 substantially aligned with those sidewalls 132.

Referring to FIG. 9A, a top view of FIG. 8A after formation of 1st mandrel spacers 134 is presented. Referring also to FIG. 9B a side cross sectional view of FIG. 9A taken along the line 9B-9B is presented. Referring also to FIG. 9C a side cross sectional view of FIG. 9A taken along the line 9C-9C is presented.

Next in the process flow, a spacer layer (not shown) is disposed over the structure 100 and anisotropically etched down to form self-aligned 1st mandrel spacers 134 in the sidewalls 132 of the mandrels 128. Additionally, a 2nd non-mandrel plug 136 is formed in the 2nd non-mandrel opening 122 during the same process. The anisotropic etching process may be a RIE process that is controlled carefully to form the spacers 134, but not remove the non-mandrel plug 136 covering the 1st hardmask layer 104. As a result, the non-mandrel plug 136 is defined by, and fully self-aligned with, the sidewalls of adjacent spacers 134.

Additionally, the areas between the 1st mandrel spacers 134 that are not covered by the mandrels 128 define a series of parallel non-mandrel line regions 138, which extend in the Y direction across the structure 100. As will be explained in greater detail herein, the non-mandrel line regions 138 will be used to form non-mandrel lines in the dielectric layer 110 later in the process flow.

Additionally it should be noted, that the area that is covered by the mandrels 128 defines a mandrel line region 140. As will be explained in greater detail herein, the mandrel line regions 140 will be used to form mandrel lines in the dielectric layer 110 later in the process flow.

It is important to note that the 1st mandrel spacers 134, non-mandrel plug 136 and mandrel plug 120 are composed of substantially the same or similar materials. In this case, they are composed of an oxide, such as a SiO2 or similar. As such, the spacers 134, non-mandrel plug 136 and mandrel plug 120 can be selectively etched together relative to the mandrels 128 or the SiN 2nd hardmask layer 106.

Referring to FIG. 10A, a top view of FIG. 9A after the mandrels 128 have been removed is presented. Referring also to FIG. 10B a side cross sectional view of FIG. 10A taken along the line 10B-10B is presented. Referring also to FIG. 10C a side cross sectional view of FIG. 10A taken along the line 10C-10C is presented.

Next in the process flow, the mandrels 128 are removed. This can be done by a wet etching process or similar.

Once the mandrels 128 are removed, the remaining 1st mandrel spacers 134, 1st mandrel plug 120 and 2nd non-mandrel plug 136 form a metal line pattern 142 disposed over the top surface of the 2nd hardmask layer 106, which will be utilized to form mandrel metal lines 144 and non-mandrel metal lines 146 in the dielectric stack 110. Additionally, the metal line pattern 142 will also be utilized to form self-aligned mandrel continuity cuts 148 and non-mandrel continuity cuts 150 in the respective mandrel and non-mandrel metal lines 144, 146.

More specifically, the exposed areas of hardmask 106 where the mandrels once were now define the mandrel line regions 140. The mandrel line regions 140 alternate with the non-mandrel line regions 138 within the pattern 142. The mandrel and non-mandrel line regions 140, 138 will be utilized to form an array of parallel metal line trenches 143 in the dielectric layer 110. The trenches 143 will then be metalized and planarized to form mandrel and non-mandrel metal lines 144, 146 therein. The mandrel plug 120 and non-mandrel plug 136 of pattern 142 will be utilized to form mandrel and non-mandrel continuity cuts (or continuity blocks) 148, 150 in the mandrel and non-mandrel lines 144, 146 respectively. The spacers 134 of pattern 142 define the spacing between the mandrel and non-mandrel metal lines 144, 146.

Referring to FIG. 11A, a top view of FIG. 10A after the metal line pattern 142 has been etched down into the 1st hardmask layer 104 is presented. Referring also to FIG. 11B a side cross sectional view of FIG. 11A taken along the line 11B-11B is presented. Referring also to FIG. 11C a side cross sectional view of FIG. 11A taken along the line 11C-11C is presented.

Next in the process flow the metal line pattern 142 is anisotropically etched down through the SiN 2nd hardmask and into the TiN 1st hardmask, to land on the top surface of the dielectric layer 110. This may be done by a selective RIE process or similar that is selective to the oxide material of the original metal line pattern 142 in FIG. 10A.

Referring to FIG. 12A, a top view of FIG. 11A after metal line pattern 142 has been etched and metalized into the dielectric layer 110 is presented. Referring also to FIG. 12B a side cross sectional view of FIG. 12A taken along the line 12B-12B is presented. Referring also to FIG. 12C a side cross sectional view of FIG. 12A taken along the line 12C-12C is presented.

Next in the process flow, the metal line pattern 142 is anisotropically etched into the dielectric layer 110 to form a series of parallel metal line trenches 143 in the dielectric layer 110. The metal line trenches 143 are then metalized to fill the trenches with such metal as tungsten, copper, cobalt, aluminum, ruthenium or the like. This can be done by PVD, CVD, electroless metal plating or similar.

The overflow or excess metal is then planarized down to finalize the formation of the mandrel metal lines 144 and non-mandrel metal lines 146. The dielectric metal line spacings 152 between the metal lines 144, 146 are formed from the 1st mandrel spacers 134 that were disposed on the sidewalls of the original mandrels 128. The spacers 134 functioned as a mask to protect the underlying dielectric layer from the etching process and also functioned as a series of molds to define the boundaries of the mandrel and non-mandrel metal lines 144, 146.

Disposed across a mandrel metal line 144 is the mandrel continuity cut 148. Mandrel continuity cut 148 was formed from the 1st mandrel plug 120, which functioned as a mandrel line block mask during the etching process into the dielectric layer 110. Additionally, disposed across a non-mandrel metal line 146 is the non-mandrel continuity cut 150. Non-mandrel continuity cut 150 was formed from the 2nd non-mandrel plug 136, which functioned as a non-mandrel line block mask during the etching process into the dielectric layer 110.

Advantageously, both the mandrel continuity cut 148 and non-mandrel continuity cut 150 are now self-aligned with the sidewalls of the metal line spacings 152. Additionally, the self-aligned continuity cuts 148, 150 are less susceptible to lithographic tolerances than prior art continuity cuts. Moreover, the cuts 148, 150 can be disposed in metal line arrays that have a pitch of 40 nm or less without clipping neighboring metal lines.

Even though only one mandrel continuity cut 148 and one non-mandrel continuity cut 150 are illustrated in the above embodiments, any number of such cuts may be disposed in an array of metal lines using this method. Further with this method, any one type of mandrel and non-mandrel continuity cuts 148, 150 may be disposed in an array of metal lines without having to dispose the other type.

FIGS. 13A-21C illustrate an alternative exemplary embodiment of a method of making self-aligned continuity cuts in mandrel and non-mandrel metal lines for integrated circuits in accordance with the present invention. In this embodiment, the method of forming mandrel and non-mandrel continuity cuts is applied to a self-aligned quadruple patterning (SAQP) process (herein, the SAQP method) rather than a self-aligned double patterning (SADP) process as described in FIGS. 3-12C (herein, the SADP method). As such however, many method steps and features of this SAQP method will be substantially identical to the method steps used in the SADP method. Where those features in the SAQP method are substantially identical to the features in the SADP method, the same reference numbers will be used.

Referring to FIG. 13A a simplified top view of an exemplary embodiment of a structure 200 for an integrated circuit device in accordance with the present invention is presented at an intermediate stage of manufacturing. Referring also to FIG. 13B a side cross sectional view of FIG. 13A taken along the line 13B-13B is presented. Referring also to FIG. 13C a side cross sectional view of FIG. 13A taken along the line 13C-13C is presented.

The initial method steps in this SAQP method are virtually identical to the initial method steps described in FIGS. 3-6C of the SADP method. However, as illustrated in FIGS. 13A, B and C, the next step in the process flow of the SAQP method differs from the SADP method in that the 2nd mandrel layer 126 and an additional 3rd mandrel layer 202 are disposed over the structure 200. The 2nd mandrel layer is composed of the same aSi as the 1st mandrel layer 108. However the material composition of the 3rd mandrel layer 202 is different from that of the 1st and 2nd mandrel layers 108, 126 in order to be etch selective from them. In this embodiment, the 3rd mandrel layer 202 is composed of an amorphous carbon (aC).

Referring to FIG. 14A, a top view of FIG. 13A after 2nd mandrels 204 and 2nd mandrel spacers 206 are formed thereon is presented. Referring also to FIG. 14B a side cross sectional view of FIG. 14A taken along the line 14B-14B is presented. Referring also to FIG. 14C a side cross sectional view of FIG. 14A taken along the line 14C-14C is presented.

Next in the process flow of the SAQP method, the 3rd mandrel layer is patterned and etched into an array of 2nd mandrels 204 in substantially the same or similar fashion as the formation of the 1st mandrels 128. Additionally, 2nd mandrels spacers 206 are formed on the sidewalls of the 2nd mandrels 204 in much the same or similar fashion as the formation of the 1st mandrel spacers 134.

The 2nd mandrel spacers 206 are composed of substantially the same or similar material as the 1st mandrel spacers 134 and 1st mandrel plug 120. In this embodiment, the 2nd mandrel spacers 206 are composed of an oxide, such as a SiO2 or similar.

It is important to note that, in this exemplary embodiment, the well-known pitch (i.e., the distance between repetitive features on a semiconductor structure) of the 2nd mandrels 204 is equal to the pitch of the 1st mandrels 128. Since the SAQP process is basically the SADP process applied twice, the final pitch of the metal lines 144, 146 disposed in the dielectric layer 110 of structure 200 (best seen in FIGS. 21A, B, C) will be substantially half the pitch of the metal lines 144, 146 disposed in the dielectric layer 110 of structure 100 (best seen in FIGS. 12A, B, C). By way of example, if the pitch of the 1st mandrels 128 of structure 100 were 80 nm, the pitch of the metal lines 144, 146 would be substantially 40 nm (halved by the application of the 1st mandrel spacers 134 on the sidewalls of the mandrels 128 in the SADP process). However, with the pitch of the 2nd mandrels 204 of structure 200 set at substantially the same 80 nm, the pitch of the metal lines 144, 146 would be substantially 20 nm (quartered by the application of the SADP process twice).

Referring to FIG. 15A, a top view of FIG. 14A after the 2nd mandrels 204 have been removed is presented. Referring also to FIG. 15B a side cross sectional view of FIG. 15A taken along the line 15B-15B is presented. Referring also to FIG. 15C a side cross sectional view of FIG. 15A taken along the line 15C-15C is presented.

Next in the process flow, the 2nd mandrels 204 are removed, leaving the 2nd mandrel spacers 206. The 2nd mandrel spacers effectively halve the pitch of the 2nd mandrels. The 2nd mandrels can be removed by a wet etching process or similar.

Referring to FIG. 16A, a top view of FIG. 15A after the 1st mandrels 128 have been formed is presented. Referring also to FIG. 16B a side cross sectional view of FIG. 16A taken along the line 16B-16B is presented. Referring also to FIG. 16C a side cross sectional view of FIG. 16A taken along the line 16C-16C is presented.

Next in the process flow, the aSi 1st and 2nd mandrel layers 108, 126 are RIE etched selective to the oxide 2nd mandrel spacers 206 and oxide 1st mandrel plug 120. This process forms the 1st mandrels 128 with their vertical sidewalls 132 and exposed the 1st mandrel plug 120.

Referring to FIG. 17A, a top view of FIG. 16A after the oxide 2nd mandrel spacers 206 and oxide 1st mandrel plug 120 have been etched is presented. Referring also to FIG. 17B a side cross sectional view of FIG. 17A taken along the line 17B-17B is presented. Referring also to FIG. 17C a side cross sectional view of FIG. 17A taken along the line 17C-17C is presented.

Next in the process flow, both the oxide 2nd mandrel spacers 206 and 1st mandrel plug 120 are anisotropically etched, such as with a RIE process or similar. As such the 2nd mandrel spacers 206 are removed and the 1st mandrel plug is now self-aligned with the sidewalls 132 of the 1st mandrel 128B.

It is important to note, that at this stage of the process flow, the structure 200 as illustrated in FIGS. 17A, 17B and 17C is almost identical to the structure 100 as illustrated in FIGS. 8A, 8B and 8C. The only difference is that the pitch of the 1st mandrels 128 in structure 200 is half the pitch of the 1st mandrel 128 in structure 100 due to the SAQP process. However, because all the structural features are identical, the reference numbers used are also identical to that of FIGS. 8A, B and C.

It is also important to note, that the rest of the process flow for the SAQP method for forming self-aligned continuity cuts in structure 200 is now substantially identical to the process flow for the SADP process for forming self-aligned continuity cuts in structure 100. As such the remaining FIGS. 18A-21C of structure 200 are substantially identical to the FIGS. 9A-12C of structure 100. Again, the only physical difference is that the pitch in FIGS. 18A-21C is half that of FIGS. 9A-12C due to the SAQP process. Accordingly, since the process flow for FIGS. 9A-12C has been discussed in detail, the process flow for FIGS. 18A-21C will be discussed in summary.

Referring to FIG. 18A, a top view of FIG. 17A after formation of 1st mandrel spacers 134 is presented. Referring also to FIG. 18B a side cross sectional view of FIG. 18A taken along the line 18B-18B is presented. Referring also to FIG. 18C a side cross sectional view of FIG. 18A taken along the line 18C-18C is presented.

Next in the process flow, the 1st mandrel spacers 134 are formed and the 2nd non-mandrel plug 136 is formed. The non-mandrel line region 138 is not defined by the edges of adjacent spacers 134. The non-mandrel line region 138 being the area between the spacers 134 that is not covered by the mandrels 128. Additionally, it should be noted that the mandrel line region 140 is the area that is covered by the mandrels 128.

Referring to FIG. 19A, a top view of FIG. 18A after the mandrels 128 have been removed is presented. Referring also to FIG. 19B a side cross sectional view of FIG. 19A taken along the line 19B-19B is presented. Referring also to FIG. 19C a side cross sectional view of FIG. 19A taken along the line 19C-19C is presented.

Next in the process flow, the 1st mandrels 128 are removed. The plugs 120, 136 are self-aligned with the spacers 134. Additionally, the metal line pattern 142 is formed.

Referring to FIG. 20A, a top view of FIG. 19A after the metal line pattern 142 has been etched down into the 1st hardmask layer 104 is presented. Referring also to FIG. 20B a side cross sectional view of FIG. 20A taken along the line 20B-20B is presented. Referring also to FIG. 20C a side cross sectional view of FIG. 20A taken along the line 20C-20C is presented.

Next in the process flow the metal line pattern 142 is anisotropically etched down through the SiN 2nd hardmask and into the TiN 1st hardmask, to land on the top surface of the dielectric layer 110.

Referring to FIG. 21A, a top view of FIG. 20A after metal line pattern 142 has been etched and metalized into the dielectric layer 110 is presented. Referring also to FIG. 21B a side cross sectional view of FIG. 21A taken along the line 21B-21B is presented. Referring also to FIG. 21C a side cross sectional view of FIG. 21A taken along the line 21C-21C is presented.

Next in the process flow, the metal line pattern 142 is anisotropically etched into the dielectric layer 110 to form a series of parallel metal line trenches 143 in the dielectric layer 110. The metal line trenches 143 are then metalized and planarized to finalize the formation of the mandrel metal lines 144 and non-mandrel metal lines 146. The dielectric metal line spacings 152 between the metal lines 144, 146 are formed from the 1st mandrel spacers 134 that were disposed on the sidewalls of the original mandrels 128.

Disposed across a mandrel metal line 144 is the mandrel continuity cut 148. Mandrel continuity cut 148 was formed from the 1st mandrel plug 120. Additionally, disposed across a non-mandrel metal line 146 is the non-mandrel continuity cut 150. Non-mandrel continuity cut 150 was formed from the 2nd non-mandrel plug 136.

Advantageously, both the mandrel continuity cut 148 and non-mandrel continuity cut 150 are now self-aligned with the sidewalls of the metal line spacings 152. Additionally, the self-aligned continuity cuts 148, 150 are less susceptible to lithographic tolerances than prior art continuity cuts. Moreover, the cuts 148, 150 can be disposed in metal line arrays that have a pitch of 40 nm, 20 nm or less without clipping neighboring metal lines.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a structure having a dielectric layer, a $1^{st}$ hardmask layer, a $2^{nd}$ hardmask layer and a $1^{st}$ mandrel layer disposed respectively thereon;
   disposing a $1^{st}$ mandrel plug in the 1st mandrel layer;
   disposing a $2^{nd}$ mandrel layer over the $1^{st}$ mandrel layer;
   etching the $1^{st}$ and $2^{nd}$ mandrel layers to form a plurality 1st mandrels, wherein the $1^{st}$ mandrel plug extends entirely through a single $1^{st}$ mandrel;
   etching the $1^{st}$ mandrel plug such that it is self-aligned with sidewalls of the single $1^{st}$ mandrel;

utilizing the 1$^{st}$ mandrels to form mandrel metal lines in the dielectric layer; and utilizing the 1$^{st}$ mandrel plug to form a self-aligned mandrel continuity cut in a single mandrel metal line formed by the single 1$^{st}$ mandrel.

2. The method of claim 1 comprising:

disposing a 2$^{nd}$ non-mandrel opening in the 2$^{nd}$ hardmask layer prior to disposing the 2$^{nd}$ mandrel layer, the 2$^{nd}$ non-mandrel opening positioned to extend between a pair of adjacent 1$^{st}$ mandrels after the 1$^{st}$ mandrels have been formed;

disposing a spacer layer over the structure;

etching the spacer layer to form 1$^{st}$ mandrel spacers on sidewalls of the 1$^{st}$ mandrels and a 2$^{nd}$ non-mandrel plug in the 2$^{nd}$ non-mandrel opening, wherein:

areas between the 1$^{st}$ mandrel spacers that are not covered by the 1$^{st}$ mandrels define non-mandrel line regions, areas covered by the 1$^{st}$ mandrels define mandrel line regions, and the 2$^{nd}$ non-mandrel plug is self-aligned with sidewalls of adjacent 2$^{nd}$ non-mandrel spacers; and utilizing the mandrel and non-mandrel line regions to form mandrel and non-mandrel metal lines respectively, and the 2$^{nd}$ non-mandrel plug to form a self-aligned non-mandrel continuity cut in a non-mandrel metal line, within the dielectric layer.

3. The method of claim 2 comprising:

removing the 1$^{st}$ mandrels from the structure; and forming a metal line pattern from the remaining 1$^{st}$ mandrel spacers, 1$^{st}$ mandrel plug and 2$^{nd}$ non-mandrel plug, wherein the mandrel line regions alternate with the non-mandrel line regions within the pattern.

4. The method of claim 3 comprising etching the metal line pattern down through the 2$^{nd}$ hardmask layer and into the 1$^{st}$ hardmask layer to dispose the pattern over the dielectric layer.

5. The method of claim 4 comprising:

etching the metal line pattern into the dielectric layer to form a series of parallel metal line trenches therein; and metalizing and planarizing the trenches wherein:

the metalized trenches form the mandrel and non-mandrel metal lines, the 1$^{st}$ mandrel spacers of the pattern form spacings between the metal lines, the 1$^{st}$ mandrel plug of the pattern forms the mandrel continuity cut, and the 2$^{nd}$ mandrel plug of the pattern forms the non-mandrel continuity cut.

6. The method of claim 2 comprising:

disposing a 3$^{rd}$ mandrel layer over the 1$^{st}$ and 2$^{nd}$ mandrel layers;

patterning and etching 2$^{nd}$ mandrels into the 3$^{rd}$ mandrel layer;

forming 2$^{nd}$ mandrel spacers on sidewalls of the 2$^{nd}$ mandrels;

removing the 2$^{nd}$ mandrels; and etching the 1$^{st}$ and 2$^{nd}$ mandrel layers selective to the 2$^{nd}$ mandrel spacers to form the 1$^{st}$ mandrels.

7. The method of claim 6 comprising:

the 1$^{st}$ and 2$^{nd}$ mandrel layers having substantially the same material compositions;

the 1$^{st}$ and 3$^{rd}$ mandrel layers having a substantially different material compositions;

the 1$^{st}$ mandrel plug having a material composition that is substantially different from the 1$^{st}$ and 3$^{rd}$ mandrel layers; and the 1$^{st}$ mandrel plug, the 2$^{nd}$ non-mandrel plug and the 1$^{st}$ mandrel spacers having substantially the same material composition.

8. The method of claim 1 wherein the method is one of a self-aligned double patterning process and a self-aligned quadruple patterning process.

9. The method of claim 1 wherein the 1$^{st}$ and 2$^{nd}$ mandrel layers have substantially the same material composition.

10. The method of claim 9 wherein the 1$^{st}$ mandrel plug and the 1$^{st}$ mandrel layer have a substantially different material composition.

* * * * *